United States Patent
Lo et al.

(10) Patent No.: US 11,322,427 B2
(45) Date of Patent: May 3, 2022

(54) CHIP ON FILM PACKAGE

(71) Applicant: Novatek Microelectronics Corp., Hsinchu (TW)

(72) Inventors: Hsien-Wen Lo, Hsinchu County (TW); Wen-Ching Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 199 days.

(21) Appl. No.: 16/508,333

(22) Filed: Jul. 11, 2019

(65) Prior Publication Data

US 2020/0027821 A1    Jan. 23, 2020

Related U.S. Application Data

(60) Provisional application No. 62/700,918, filed on Jul. 20, 2018.

(51) Int. Cl.
    *H01L 23/48*    (2006.01)
    *H01L 23/00*    (2006.01)
    *H01L 27/12*    (2006.01)

(52) U.S. Cl.
    CPC .......... *H01L 23/481* (2013.01); *H01L 24/17* (2013.01); *H01L 27/1214* (2013.01)

(58) Field of Classification Search
    CPC ............. H01L 23/481; H01L 23/3114; H01L 23/49805; H01L 2223/54486; H01L 2224/12105; H01L 21/4825; H01L 21/4853; H01L 23/047; H01L 23/4951;
    (Continued)

(56) References Cited

U.S. PATENT DOCUMENTS

| 7,061,785 B2 | 6/2006 | Miwa et al. |
| 7,286,386 B2 | 10/2007 | Miwa et al. |
| 8,853,694 B2 | 10/2014 | Han et al. |

(Continued)

FOREIGN PATENT DOCUMENTS

| CN | 1481021 | 3/2004 |
| CN | 100466246 | 3/2009 |

(Continued)

OTHER PUBLICATIONS

"Office Action of China Counterpart Application", dated Oct. 13, 2020, p. 1-p. 9.

(Continued)

*Primary Examiner* — Marcos D. Pizarro
*Assistant Examiner* — Quinton A Brasfield
(74) *Attorney, Agent, or Firm* — JCIPRNET

(57) ABSTRACT

A chip on film package including a chip and a flexible film. The chip includes bumps disposed on the chip and is mounted on the flexible film. The flexible film includes first vias, second vias, upper leads and lower leads. The first vias and the second vias penetrate the flexible film and are arranged on two opposite sides of a reference line respectively. A distance between one of the first vias and one of the second vias, which are closer to a first side of the chip, is longer than that between another one of the first vias and another one of the second, which are further from the first side. The upper leads are disposed on the upper surface connected between the vias and the bumps. The lower leads are disposed on the lower surface and connected to the vias.

26 Claims, 29 Drawing Sheets

(58) Field of Classification Search
CPC .......... H01L 23/4952; H01L 23/49811; H01L 2223/5448
See application file for complete search history.

(56) References Cited

U.S. PATENT DOCUMENTS

| | | | |
|---|---|---|---|
| 10,262,590 B2* | 4/2019 | Fujikawa | ............ G09G 3/3648 |
| 10,304,764 B2 | 5/2019 | Chung et al. | |
| 2004/0027869 A1 | 2/2004 | Miwa et al. | |
| 2006/0060949 A1* | 3/2006 | Naitoh | ................ H01L 23/4985 |
| | | | 257/676 |
| 2006/0180943 A1 | 8/2006 | Miwa et al. | |
| 2013/0161616 A1 | 6/2013 | Hsu et al. | |
| 2016/0218053 A1* | 7/2016 | Cho | ........................ H01L 24/00 |
| 2017/0372992 A1 | 12/2017 | Chung et al. | |
| 2019/0080996 A1* | 3/2019 | Chen | ................. H01L 23/49811 |

FOREIGN PATENT DOCUMENTS

| | | |
|---|---|---|
| CN | 107546208 | 1/2018 |
| CN | 110739292 | 1/2020 |
| TW | 201810550 | 3/2018 |

OTHER PUBLICATIONS

"Office Action of Taiwan Counterpart Application", dated Apr. 7, 2020, p. 1-p. 4.

* cited by examiner

CHIP ON FILM PACKAGE

CROSS-REFERENCE TO RELATED APPLICATION

This application claims the priority benefit of U.S. provisional application Ser. No. 62/700,918, filed on Jul. 20, 2018. The entirety of the above-mentioned patent application is hereby incorporated by reference herein and made a part of this specification.

BACKGROUND

Technical Field

The present disclosure generally relates to chip package. More particularly, the present disclosure relates to a chip on film package.

Description of Related Art

Due to rapid progress in semiconductor device and display device fabrication, multi-media communication is becoming increasingly popular. Although cathode ray tube (CRT) displays can provide relatively high image quality at a low cost, thin film transistor (TFT) liquid crystal display (LCD) devices are gradually replacing CRTs because the TFT LCD is thinner and consumes less power. However, aside from a liquid crystal display panel, a LCD display also needs a driver IC to drive the display panel. In recent years, the demand to display a huge volume of data has jacked up the total number of input/output (I/O) terminals needed on a liquid crystal panel driver. In addition, the driver IC must correspond in size with the liquid crystal display panel. Hence, the driver IC often has a rectangular plan so that the number of I/O pads along the edges of the driver IC is maximized. Typically, a driver chip and a liquid crystal display panel are joined together in a chip-on-glass (COG) process, a chip-on-film (COF) process, a chip-on-board (COB) process or a tape-automated-bonding (TAB) process.

SUMMARY

Accordingly, the present disclosure is directed to a chip on film package, wherein the layout area for vias on the flexible film is reduced, and the bump pitch of the chip may also be reduced.

The present disclosure provides a chip on film package including a chip and a flexible film. The chip includes a plurality of bumps disposed on an active surface of the chip. The chip is mounted on the flexible film via the active surface, and the flexible film includes a plurality of first vias, a plurality of second vias, a plurality of upper leads and a plurality of lower leads. The first vias penetrate the flexible film. The second vias penetrate the flexible film. The first vias and the second vias are arranged on two opposite sides of a reference line respectively. A distance between one of the first vias and one of the second vias, which are closer to a first side of the chip, is longer than that between another one of the first vias and another one of the second, which are further from the first side of the chip. The upper leads are disposed on the upper surface connected between the first vias and the bumps and between the second vias and the bumps. The lower leads are disposed on the lower surface, connected to the first vias and the second vias, and extending toward the first side or a second side of the chip opposite to the first side.

According to an embodiment of the present disclosure, the first vias are arranged along a first arrangement direction not parallel to the reference line, and the second vias are arranged along a second arrangement direction not parallel to the reference line.

According to an embodiment of the present disclosure, the first vias are arranged symmetrically to the second vias with respect to a reference line.

According to an embodiment of the present disclosure, the bumps include a plurality of first bumps arranged as a first row along a first direction, and a plurality of second bump arranged as a second row along a second direction, and each of the second bumps is closer to the first side of the chip than each of the first bumps is.

According to an embodiment of the present disclosure, one of the second bumps is located between adjacent two of the first bumps.

According to an embodiment of the present disclosure, the first bumps are odd-numbered output bumps and the second bumps are even-numbered output bumps.

According to an embodiment of the present disclosure, the first bumps are even-numbered output bumps and the second bumps are odd-numbered output bumps.

According to an embodiment of the present disclosure, the upper leads include: a plurality of first upper leads connected between the first vias or the second vias and the first bumps, respectively; and a plurality of second upper leads connected to the second bumps respectively and extending toward the first side of the chip.

According to an embodiment of the present disclosure, the lower leads include a plurality of first lower leads connected to the first vias and the second vias and extending toward one of the first side and the second side of the chip.

According to an embodiment of the present disclosure, the lower leads further includes a plurality of second lower leads connected the first vias and the second vias and extending toward the other one of the first side and the second side of the chip.

According to an embodiment of the present disclosure, the chip further includes a plurality of third bumps disposed on the second side of the chip.

According to an embodiment of the present disclosure, the flexible film further includes a plurality of third upper leads disposed on the upper surface, connected to the third bumps, and extending toward the second side of the chip.

According to an embodiment of the present disclosure, the third bumps include output bumps of the chip.

According to an embodiment of the present disclosure, the third bumps comprise input bumps of the chip.

According to an embodiment of the present disclosure, the first bumps includes a first set of the first bumps and a second set of the first bumps arranged along the first direction in a staggered manner.

According to an embodiment of the present disclosure, the second bumps includes a first set of the second bumps and a second set of the second bumps arranged along the second direction in a staggered manner.

According to an embodiment of the present disclosure, one of the first vias and one of the second vias closest to the first bumps are disposed between the first bumps.

According to an embodiment of the present disclosure, the first bumps include a first shifted set of first bumps coupled to the one of the first vias and the one of the second vias closest to the first bumps and disposed between the second bumps along the second direction.

According to an embodiment of the present disclosure, the chip on film package further includes one or more extended vias disposed beyond a chip mounting region of the flexible film where the chip is mounted.

According to an embodiment of the present disclosure, the first bumps include a second shifted set of first bumps connected to the one or more extended vias and disposed between the second bumps along the second direction.

According to an embodiment of the present disclosure, the chip on film package further includes one or more extended upper leads disposed on the upper surface of the flexible film and connected to the one or more extended vias.

According to an embodiment of the present disclosure, the one or more extended upper leads include a first set of extended upper leads connected between the one or more extended vias and the second shifted set of first bumps.

According to an embodiment of the present disclosure, the one or more extended upper leads include a second set of extended upper leads connected to the one or more extended vias and extended to the first side of the chip.

According to an embodiment of the present disclosure, the chip on film package further includes one or more extended lower leads disposed on the lower surface of the flexible film and connected to the one or more extended vias and extended to the first side or the second side of the chip.

According to an embodiment of the present disclosure, the extended vias on the lower surface of the flexible film are disposed between the lower upper leads connected to the first vias and the lower upper leads connected to the second vias.

According to an embodiment of the present disclosure, the bumps include a plurality of first bumps arranged as at least one first row and connected by the upper leads to the first vias and the second vias; and a plurality of second bump arrange as at least one second row connected to the upper leads without being connected to the first vias and the second vias.

According to an embodiment of the present disclosure, the first bumps include a first shifted set of first bumps coupled to one of the first vias and one of the second vias closest to the first bumps and disposed between the second bumps along the second direction.

According to an embodiment of the present disclosure, the chip on film package further includes one or more extended vias disposed beyond a chip mounting region of the flexible film where the chip is mounted.

According to an embodiment of the present disclosure, the extended vias on the lower surface of the flexible film are disposed between the lower upper leads connected to the first vias and the lower upper leads connected to the second vias.

In light of the foregoing, in the chip on film package of the disclosure, the first vias and the second vias penetrating the flexible film are arranged on two opposite sides of a reference line respectively, and the distances between the first vias and the second vias are gradually increased from one side to another side of the chip. With such arrangement, the layout area of the vias can be reduced, and the size of the chip can be reduced accordingly, especially the chip length along a longitudinal direction of the chip. Moreover, under a predetermined chip length, the pitches of the bumps along a transversal direction of the chip can be reduced, and the number of the bumps can be increased accordingly. Therefore, a space utilizing efficiency of the chip on film package can be significantly improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
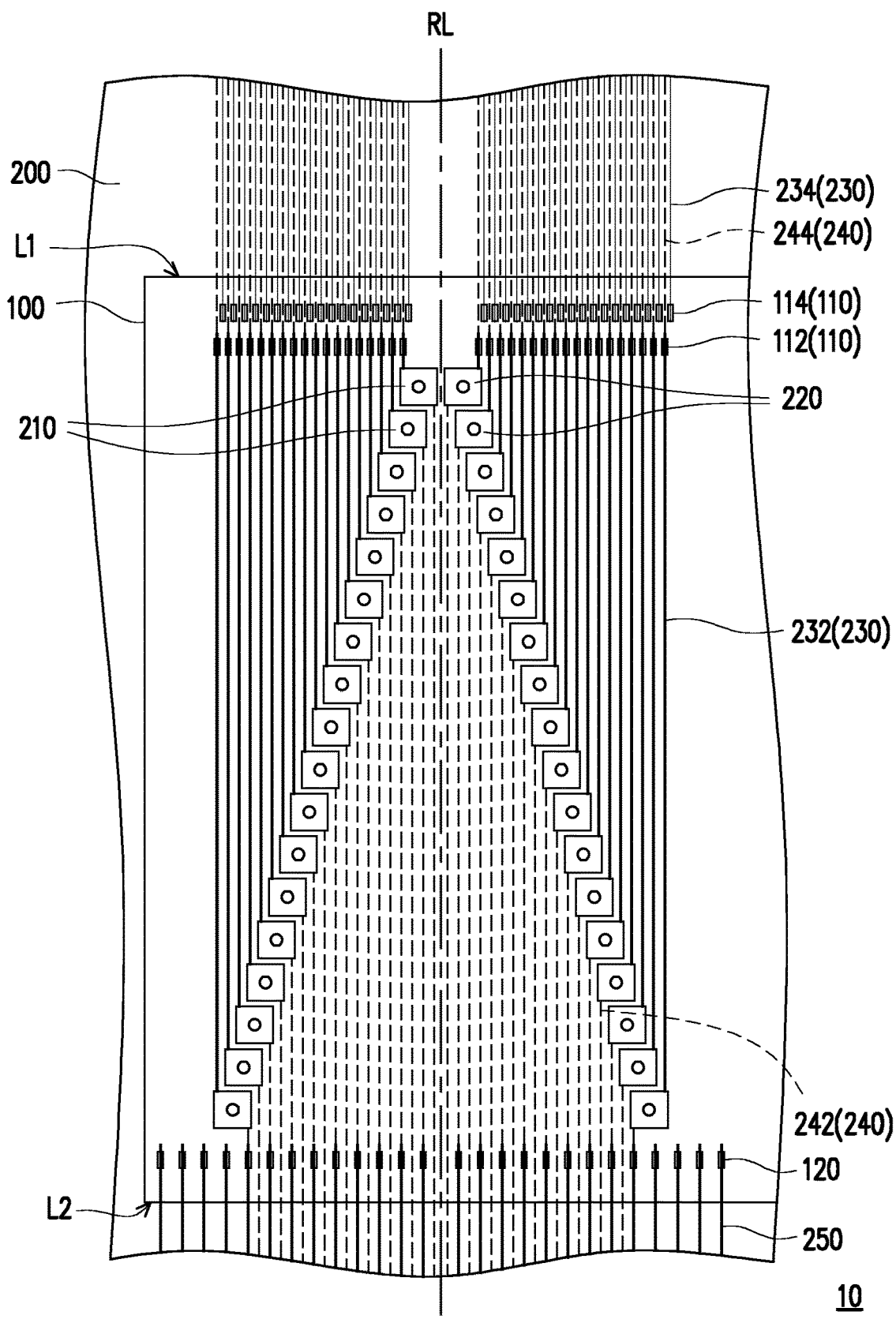
FIG. 1 illustrate a perspective top view of a chip on film package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Reference will now be made in detail to the present preferred embodiments of the disclosure, examples of which are illustrated in the accompanying drawings. Wherever possible, the same reference numbers are used in the drawings and the description to refer to the same or like parts. The terms used herein such as "on", "above", "below", "front", "back", "left" and "right" are for the purpose of describing directions in the figures only and are not intended to be limiting of the disclosure. Further, in the discussion and claims herein, the term "on" used with respect to two materials, one "on" the other, means at least some contact between the materials, while "over" and "overlie" mean the materials are in proximity, but possibly with one or more additional intervening materials such that physical contact is possible but not required. Neither "on" nor "over" implies any directionality as used herein.

Unless limited otherwise, the terms "disposed", "connected", "coupled", "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Accordingly, the drawings and descriptions will be regarded as illustrative in nature and not as restrictive.

Figure 2:
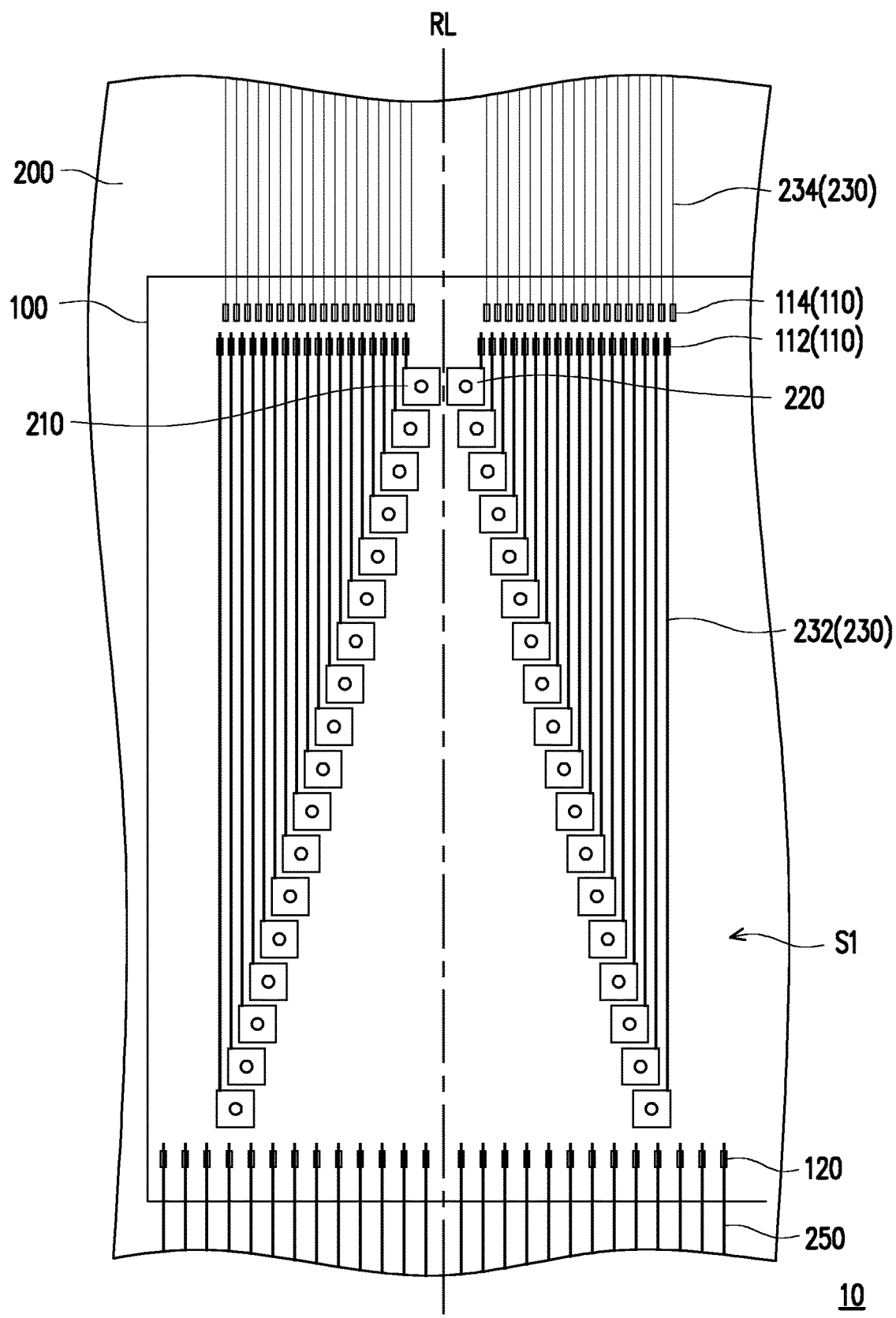
FIG. 2 illustrate a schematic top view of a chip on film package in FIG. 1.
Figure 3:
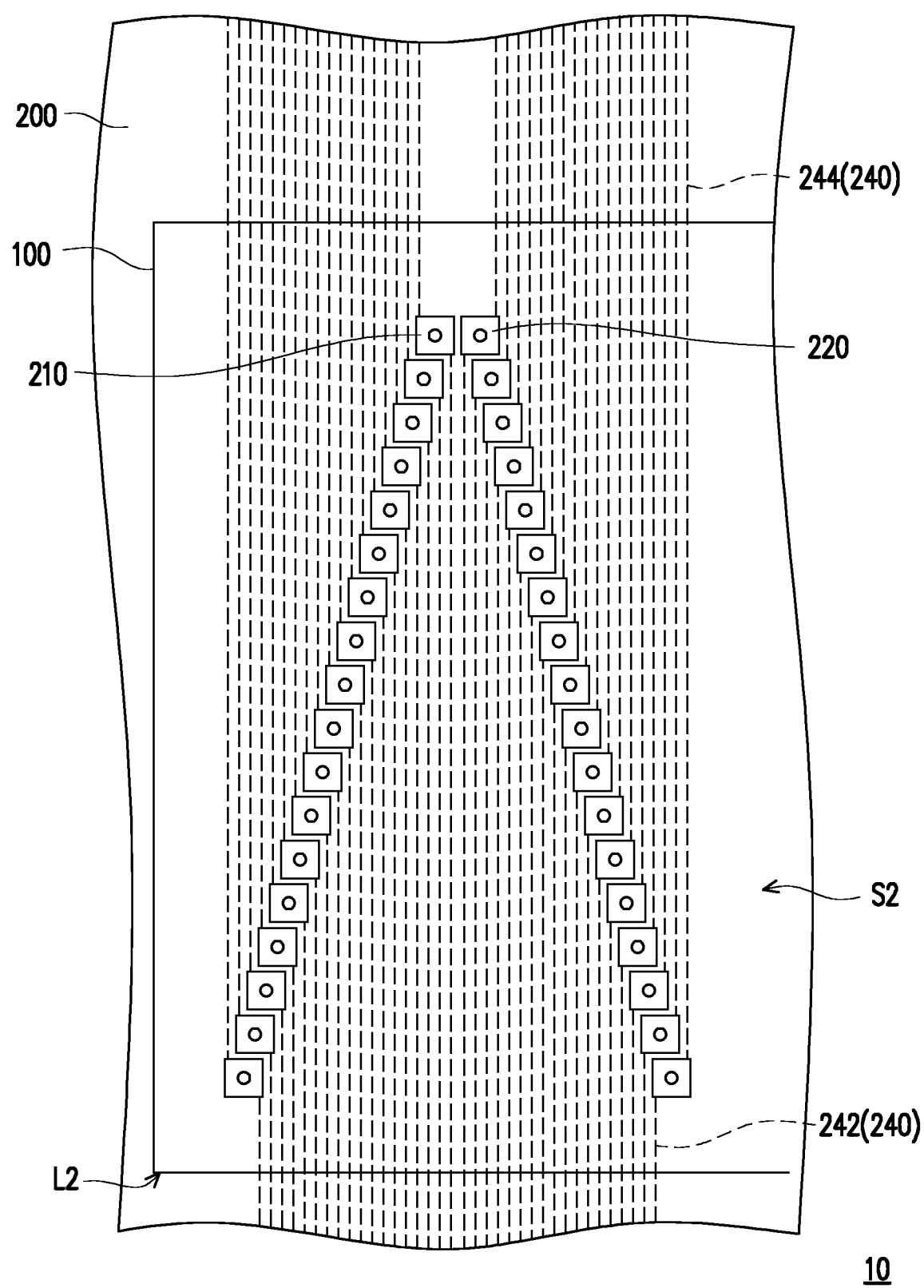
FIG. 3 illustrate a schematic bottom view of a chip on film package in FIG. 1.

FIG. 1 illustrate a perspective top view of a chip on film package according to an embodiment of the disclosure. FIG. 2 illustrate a schematic top view of a chip on film package in FIG. 1. FIG. 3 illustrate a schematic bottom view of a chip on film package in FIG. 1. It is noted that the chip 100 and the flexible film 200 of the chip on film package 10 in FIG. 1 are illustrated in a perspective manner to show layouts of the bottom surfaces thereof. For clarity and simplicity purpose, the lower leads 240 are omitted in FIG. 2, and the upper leads 230 are omitted in FIG. 3.

Referring to FIG. 1, in the present embodiment, the chip on film package 10 includes a chip 100 and a flexible film 200. The chip 100 includes a plurality of bumps 110 disposed on an active surface (e.g., a bottom surface facing the flexible film 200) of the chip 100. In some embodiments, the bumps 110 are arranged along at least one side (e.g., a first side L1) of the chip 110. The bumps 110 can be arrange in one or more rows along the first side L1 of the bumps 110 as illustrated but not limited thereto. In some embodiments, the chip 100 may be applied to a display panel. For example, the display panel may be a Liquid crystal display (LCD) panel or a Light Emitting Diode (LED) display panel such as an Organic Light Emitting Diode (OLED) display panel, and the disclosure is not limited thereto. In some embodiments, the chip 100 may include a Si substrate, Ge substrate, GaAs substrate, alumina substrate, zirconia substrate, silicon nitride substrate, glass substrate, ceramic such as silicon carbide substrate, or any other suitable insulating substrate. In some embodiment, the chip 100 may be mounted on the flexible film 200 bonded to a glass substrate of the display panel.

In some embodiment, the chip 100 may be a driver IC, which may include a processor for driving the display panel. In the present embodiment, the chip 100 may be integrated with at least one passive device such as a resistor, a capacitor, an inductor or any combination thereof. However, the present embodiment is merely for illustration, and the disclosure does not limit the types of the chip 100. In some embodiments, the chip 100 is mounted on the flexible film 200 via its active surface.

In some embodiments, the flexible film 200 may include a plurality of first vias 210, a plurality of second vias 220, a plurality of upper leads 230 and a plurality of lower leads 240. The first vias 210 and the second vias 220 penetrate the flexible film 200 for electrically connecting the upper surface S1 shown in FIG. 2 and the lower surface S2 shown in FIG. 3. In some embodiments, the first vias 210 and the second vias 220 are arranged on two opposite sides of a reference line RL respectively. For example, the first vias 210 are arranged on a first side (e.g. the left side) of the reference line RL, and the second vias 220 are arranged on a second side (e.g. the right side) of the reference line RL. In some embodiments, the first vias 210 are arranged symmetrically to the second vias 220 with respect to the reference line RL, but the disclosure is not limited thereto.

In accordance to an exemplary embodiment of the disclosure, the first vias 210 are arranged along a first arrangement direction not parallel to the reference line RL, and the second vias 220 are arranged along a second arrangement direction not parallel to the reference line RL. In some embodiments, a distance between one of the first vias 210 (e.g., the topmost first via 210) and one of the second vias 220 (e.g., the topmost second via 210), which are closer to a first side L1 of the chip 100, is longer than a distance between another one of the first vias 210 (e.g., the second from the top of the first vias 210) and another one of the second vias (e.g., the second from the top of the second vias 220), which are further from the first side L1 of the chip 100. In other words, the distances between the first vias 210 and the second vias 220 are gradually increased from one side (e.g., the first side L1) to another side (e.g., the second side L2) of the chip 100.

With now reference to FIG. 1 and FIG. 2, in some embodiments, the upper leads 230 are disposed on the upper surface S1. The upper leads 230 are connected between the first vias 210 and the bumps 110 and connected between the second vias 220 and the bumps 110. In some embodiments, the bumps 110 may include a plurality of first bumps 112 and a plurality of second bump 114. The first bumps 112 are arranged as a first row along a first direction and the second bumps 114 are arranged as a second row along a second direction. In other words, the first bumps 112 are arranged along the first direction and the second bumps 114 are arranged along the second direction. In the present embodiment, the first direction is parallel to the second direction, but the disclosure is not limited thereto. In some embodiments, each of the second bumps 114 is closer to the first side L1 of the chip than each of the first bumps 112 is. One of the second bumps 114 may be located between adjacent two of the first bumps 112. In the present embodiments, the first bumps 112 are odd-numbered input bumps and the second bumps 114 are even-numbered input bumps, but the disclosure is not limited thereto.

In some embodiments, the first bumps 112 are arranged as at least one first row and connected by the upper leads 230 to the first vias 210 and the second vias 220. The second bumps 114 are arrange as at least one second row connected to the upper leads 230 without being connected to the first vias 210 and the second vias 220, but rather extended beyond a chip mounting area of the flexible film 200 for further electrical connection (e.g., electrically connecting pins of a display panel).

In some embodiments, the upper leads 230 include a plurality of first upper leads 232 and a plurality of second upper leads 234. The first upper leads 232 are connected between the first vias 210 and the first bumps 112 and/or connected between the second vias 220 and the first bumps 112. The second upper leads 234 are connected to the second bumps 114 respectively. The second upper leads 234 are extended toward the first side L1 of the chip 100 and may be extended beyond the chip 100 for further electrical connection (e.g., electrically connected to a plurality of pins of a display panel).

In accordance to an exemplary embodiment of the disclosure, the chip 100 may further include a plurality of third bumps 120, which are disposed on the second side L2 of the chip 100. For example, the third bumps 120 may be output bumps of the chip 100, but the disclosure is not limited thereto. In some embodiments, the flexible film 200 may further include a plurality of third upper leads 250, which are disposed on the upper surface S1. The third upper leads 250 are connected to the third bumps 120 and extend toward the second side L2 of the chip 100. In the present embodiment, the second upper leads 234 may be extended beyond the chip 100 for further electrical connection.

With now reference to FIG. 1 and FIG. 3, in some embodiments, the lower leads 240 are disposed on the lower surface S2 and are connected to the first vias 210 and the second vias 220. The lower leads 240 are extended toward the first side L1 and/or the second side L2 of the chip 100 and may be extended beyond the chip 100 for further electrical connection. In some embodiments, the lower leads 240 includes a plurality of first lower leads 242, which are connected to the first vias 210 and/or the second vias 220 and extend toward one of the first side L1 and the second side L2 of the chip 100. In some embodiments, the lower leads 240 further include a plurality of second lower leads 244, which are connected the first vias 210 and/or the second vias 220 and extend toward the other one of the first side L1 and the second side L2 of the chip 100. For example, in the present embodiment, the first lower leads 242 are connected to the first vias 210 and the second vias 220 and extend toward the second side L2 of the chip 100, and the second lower leads 244 are connected the first vias 210 and the second vias 220 and extend toward the first side L1 of the chip 100. In some embodiments, the first lower leads 242 and the second lower leads 244 may be extended beyond the chip 100 for further electrical connection. It is noted that FIG. 1 to FIG. 3 merely illustrates the layouts as one group, and the layouts can be repeated throughout the whole flexible film 200 along the X direction. The layout may not be repeated completely at the periphery of the flexible film 200.

With such arrangement, the layout area of the vias 210, 220 can be reduced, and the size of the chip 100 can be reduced accordingly, especially the chip length along a longitudinal direction of the chip 100. Moreover, under a predetermined chip length, the pitches of the bumps 110 along a transversal direction of the chip 100 can be reduced, and the number of the bumps 110 can be increased accordingly. Therefore, a space utilizing efficiency of the chip on film package 10 can be significantly improved.

Figure 4:
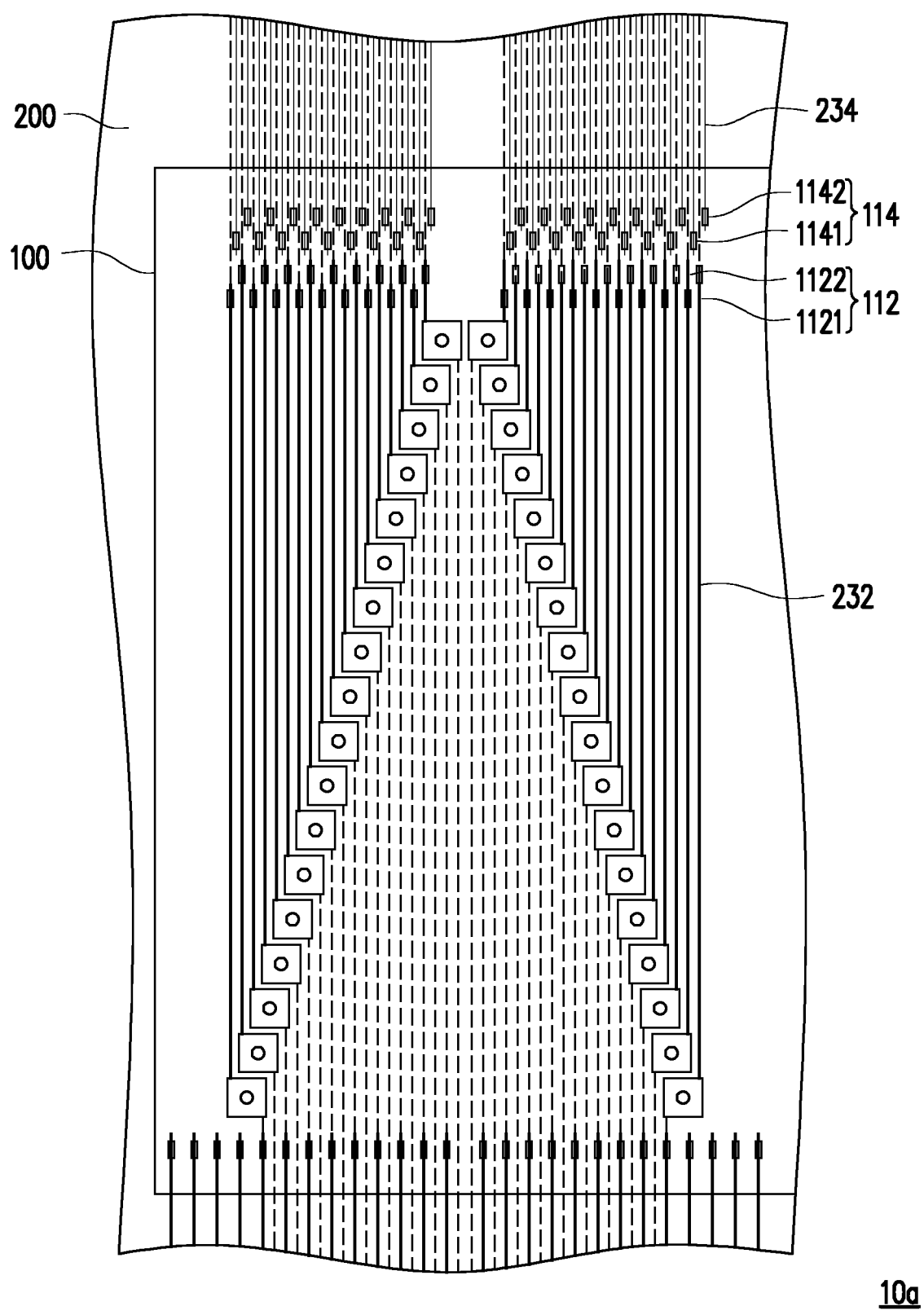
FIG. 4 illustrate a perspective top view of a chip on film package according to an embodiment of the disclosure.

FIG. 4 illustrate a perspective top view of a chip on film package according to an embodiment of the disclosure. It is noted that the chip on film package 10a shown in FIG. 4 contains many features same as or similar to the chip on film package 10 disclosed earlier with FIG. 1 to FIG. 3. For purpose of clarity and simplicity, detail description of same or similar features may be omitted, and the same or similar reference numbers denote the same or like components. The main differences between the chip on film package 10a shown in FIG. 4 and the chip on film package 10 disclosed earlier with FIG. 1 to FIG. 3 are described as follows.

With now reference to FIG. 4, in some embodiments, the first bumps 112 may include a first set of the first bumps 1121 and a second set of the first bumps 1122. The first set of the first bumps 1121 and the second set of the first bumps 1122 are arranged along the first direction in a staggered manner. Similarly, the second bumps 114 may include a first set of the second bumps 1141 and a second set of the second bumps 1142. The first set of the second bumps 1141 and the second set of the second bumps 1142 are arranged along the second direction in a staggered manner. Certainly, in other embodiments, the first set of the first bumps 1121 and the second set of the first bumps 1122 may be aligned with one another along the first direction (not in a staggered manner). Similarly, the first set of the second bumps 1141 and the second set of the second bumps 1142 may be aligned with one another along the first direction (not in a staggered manner).

With such arrangement, the bumps 112/114 are arranged along the side of the chip 100 in a staggered manner, so the pitches of the bumps 110 along the transversal direction of the chip 100 can be further reduced, and the number of the bumps 110 can be further increased accordingly. Therefore, a space utilizing efficiency of the chip on film package 10a can be further improved.

Figure 5:
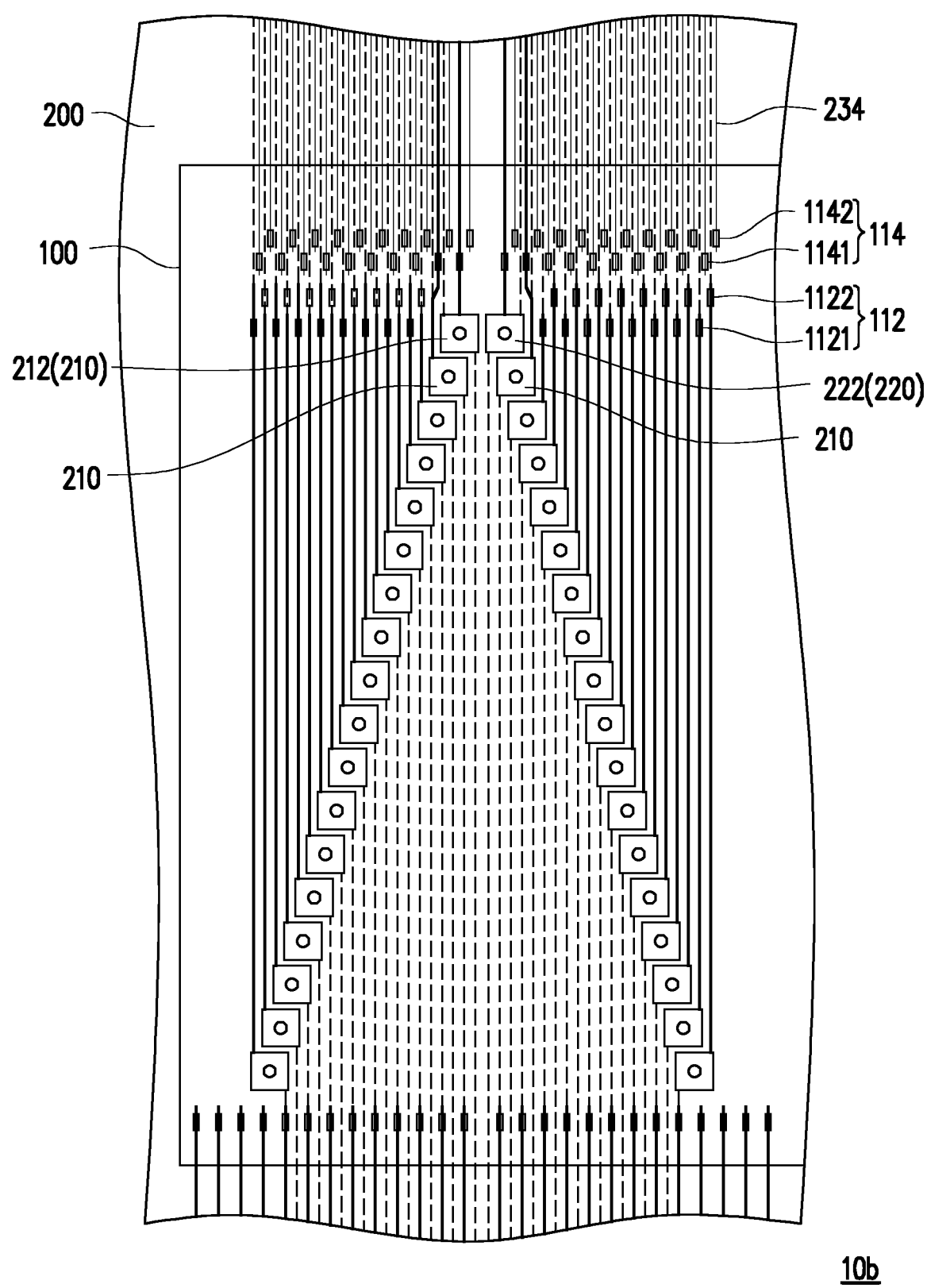
FIG. 5 illustrate a perspective top view of a chip on film package according to an embodiment of the disclosure.

FIG. 5 illustrate a perspective top view of a chip on film package according to an embodiment of the disclosure. It is noted that the chip on film package 10b shown in FIG. 5 contains many features same as or similar to the chip on film package 10a disclosed earlier with FIG. 4. For purpose of clarity and simplicity, detail description of same or similar features may be omitted, and the same or similar reference numbers denote the same or like components. The main differences between the chip on film package 10b shown in FIG. 5 and the chip on film package 10a disclosed earlier with FIG. 4 are described as follows.

With now reference to FIG. 5, in some embodiments, one of the first vias 210 (e.g., the topmost first via 210) and one of the second vias 220 (e.g., the topmost second via 220), which are closest to the first bumps 1121, are disposed between the first bumps 1121. That is to say, the first vias 210 and the second vias 220 are moved up toward the first side L1 of the chip 100. Accordingly, the layout area for the rest of the first vias 210 and the second vias 220 (e.g., the space between the input bumps 110 and the output bumps 120) can be reduced. Or else, the number of the first vias 210 and the second vias 220 that can be arranged within a predetermined chip length is increased, and the number of bumps 110 can also be increased accordingly.

Figure 6:
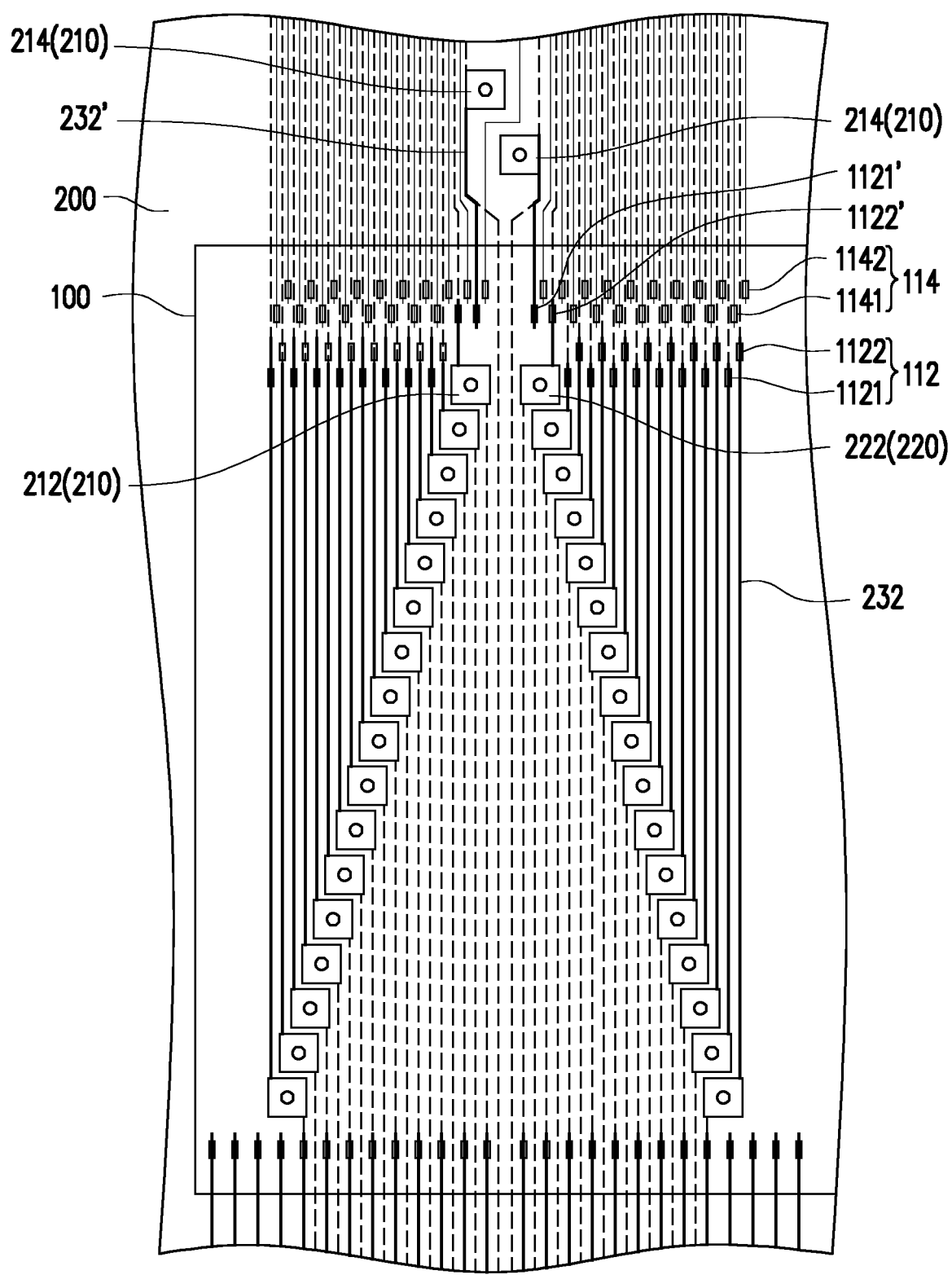
FIG. 6 illustrates a perspective top view of a chip on film package according to an embodiment of the disclosure.
Figure 7:
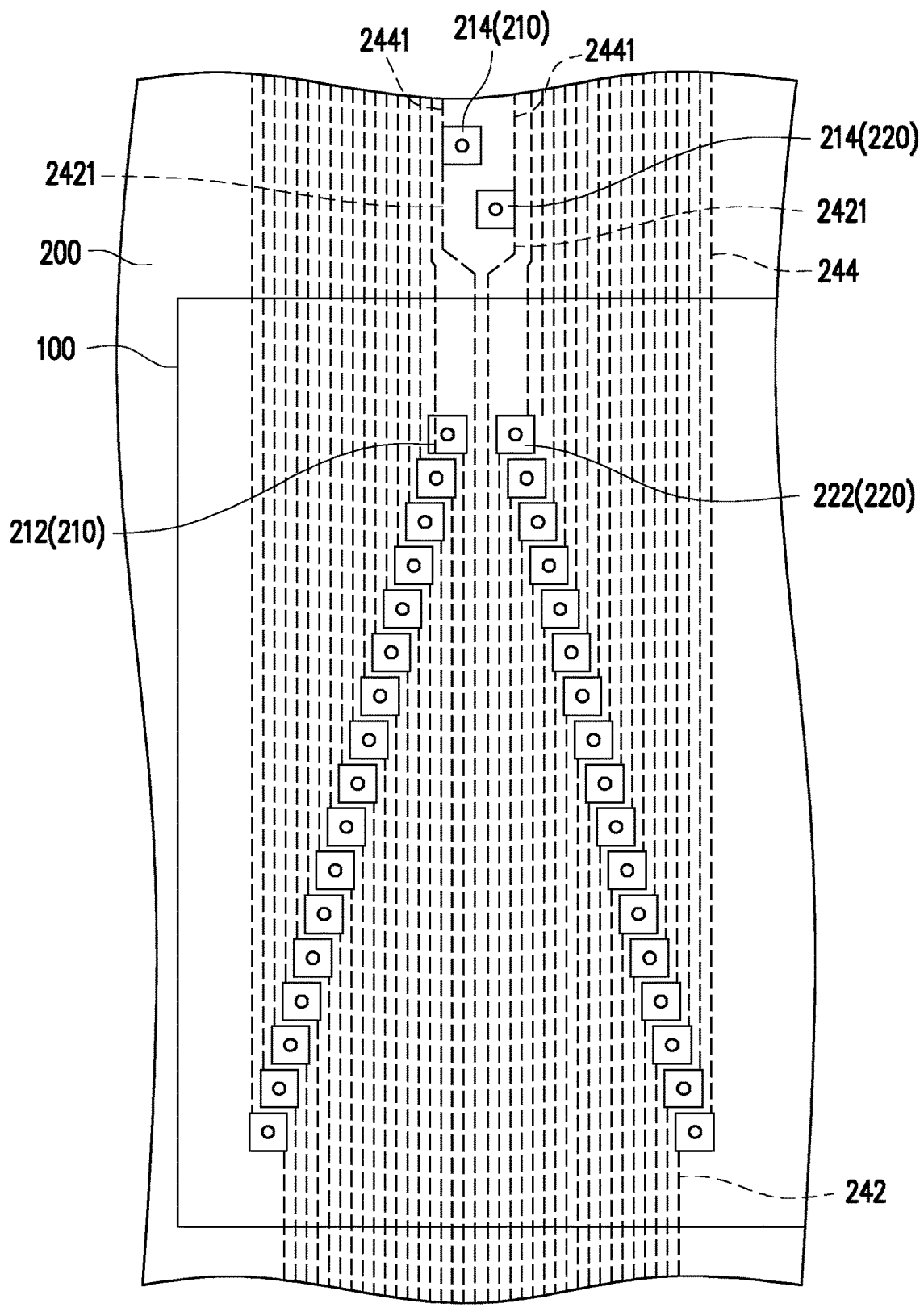
FIG. 7 illustrate a schematic bottom view of a chip on film package in FIG. 6.

FIG. 6 illustrates a perspective top view of a chip on film package according to an embodiment of the disclosure. FIG. 7 illustrate a schematic bottom view of a chip on film package in FIG. 6. It is noted that the chip on film package 10c shown in FIG. 6 and FIG. 7 contains many features same as or similar to the chip on film package 10b disclosed earlier with FIG. 5. For purpose of clarity and simplicity, detail description of same or similar features may be omitted, and the same or similar reference numbers denote the same or like components. The main differences between the chip on film package 10c shown in FIG. 6 and FIG. 7 and the chip on film package 10b disclosed earlier with FIG. 5 are described as follows.

With now reference to FIG. 6 and FIG. 7, in some embodiments, the first bumps 112 may further include a first shifted set of first bumps 1122', which are coupled to the one of the first vias 210 (e.g., the topmost first via 210) and the one of the second vias 220 (e.g., the topmost second via 210) closest to the first bumps 112. The first shifted set of first bumps 1122' are disposed between the second bumps 114 along the second direction. In some embodiments, the chip on film package 10c may further include one or more extended vias 214 (two extended vias 214 are illustrated, but not limited thereto) and one or more extended upper leads 232' (two extended upper leads 232' are illustrated, but not limited thereto). The extended vias 214 are disposed beyond a chip mounting region of the flexible film 200 where the chip 100 is mounted. Accordingly, the first bumps 112 may further include a second shifted set of first bumps 1121' connected to the extended vias 214. In some embodiments, the second shifted set of first bumps 1121' are disposed between the second bumps 114 along the second direction. The extended upper leads 232' are disposed on the upper surface S1 of the flexible film 200 and connected to the extended vias 214.

With now reference to FIG. 7, in some embodiments, the chip on film package 10c may further include one or more extended lower leads 2421, 2441. The extended lower leads 2421, 2441 are disposed on the lower surface S2 of the flexible film 200. In some embodiments, the extended lower leads 2421, 2441 are connected to the extended vias 214 and extended to the first side L1 and/or the second side L2 of the chip 100. For example, the extended lower leads 2421 are connected to the extended vias 214 and extended toward the first side L1 and the second side L2 of the chip 100. The extended lower leads 2441 are connected to the extended vias 214 and extended away from the first side L1 and the second side L2 of the chip 100.

With such arrangement, some of the vias (e.g., the extended vias 214) are moved up beyond the chip mounting region of the flexible film 200 where the chip 100 is mounted. Accordingly, the layout area for the rest of the vias (e.g., the first vias 210 and the second vias 220) can be reduced. Or else, the number of the first vias 210 and the second vias 220 that can be arranged within a predetermined chip length is further increased, and the number of bumps 110 can be further increased accordingly.

Figure 8:
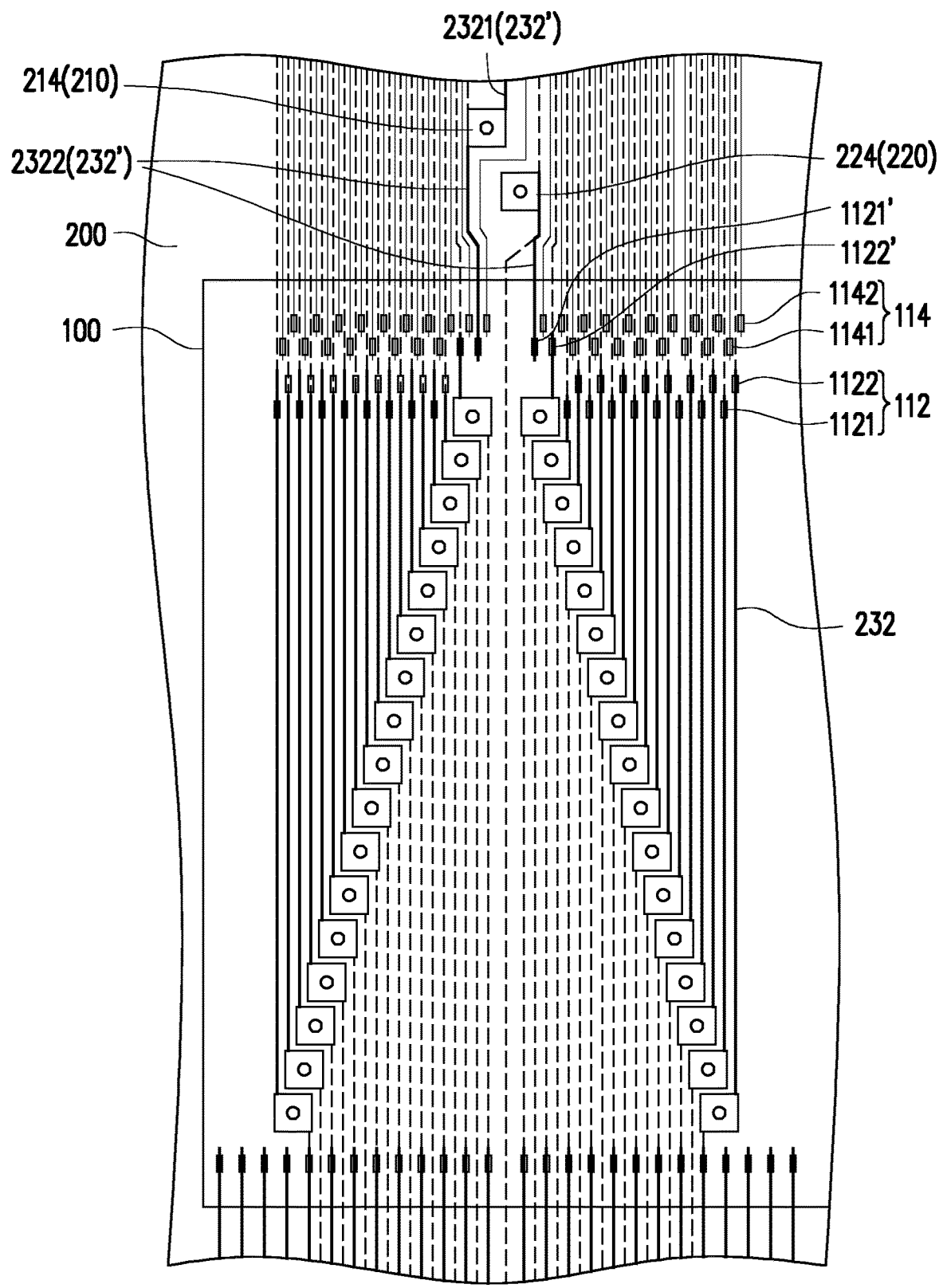
FIG. 8 illustrates a perspective top view of a chip on film package according to an embodiment of the disclosure.
Figure 9:
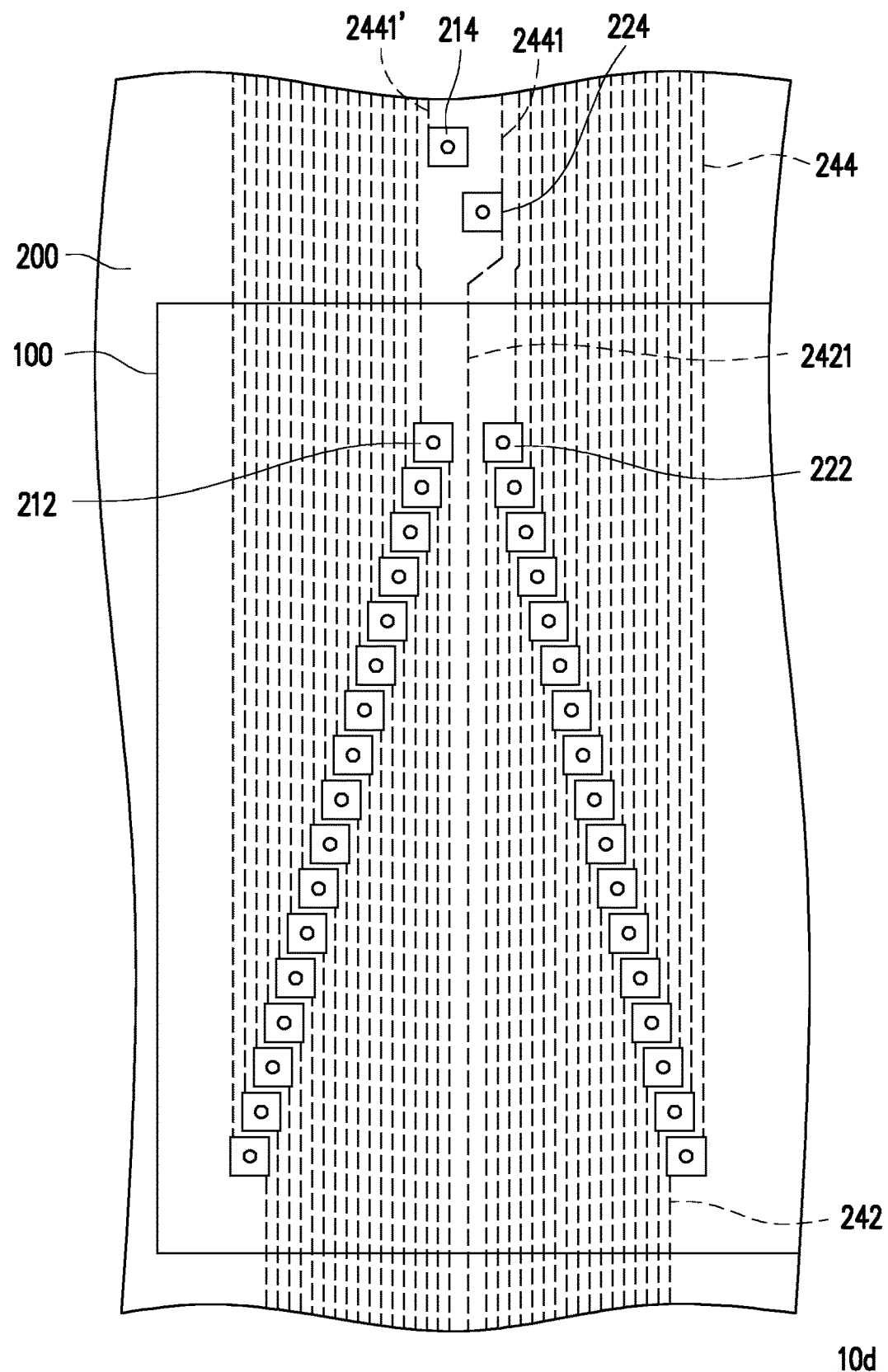
FIG. 9 illustrate a schematic bottom view of a chip on film package in FIG. 8.

FIG. 8 illustrates a perspective top view of a chip on film package according to an embodiment of the disclosure. FIG. 9 illustrate a schematic bottom view of a chip on film package in FIG. 8. It is noted that the chip on film package 10d shown in FIG. 8 and FIG. 9 contains many features same as or similar to the chip on film package 10c disclosed earlier with FIG. 6 and FIG. 7. For purpose of clarity and simplicity, detail description of same or similar features may be omitted, and the same or similar reference numbers denote the same or like components. The main differences between the chip on film package 10d shown in FIG. 8 and FIG. 9 and the chip on film package 10c disclosed earlier with FIG. 6 and FIG. 7 are described as follows.

With now reference to FIG. 8, the extended upper leads 232' may include a first set of extended upper leads 2322 and a second set of extended upper leads 2321. The first set of extended upper leads 2322 are connected between the extended vias 214, 224 and the second shifted set of first bumps 1121'. The second set of extended upper leads 2321 are connected to the extended vias 214 and extended away from the first side L1 of the chip 100. In some embodiments, the second set of extended upper leads 2321 may extend beyond the chip mounting area of the flexible film 200 for further electrical connection.

With now reference to FIG. 9, in some embodiments, the chip on film package 10f may further include one or more extended lower leads 2421, 2441, 2441'. The extended lower leads 2421, 2441, 2441' are disposed on the lower surface S2 of the flexible film 200. In some embodiments, the extended lower leads 2421, 2441, 2441' are connected to the extended vias 214, 224 and extended to the first side L1 and/or the second side L2 of the chip 100. For example, the extended lower leads 2421 are connected to the extended vias 224 and extended toward the first side L1 and the second side L2 of the chip 100. The extended lower leads 2441 are connected to the extended vias 224 and extended away from the first side L1 and the second side L2 of the chip 100. The extended lower leads 2441' are connected to the extended vias 214 and extended away from the first side L1 and the second side L2 of the chip 100. Certainly, the disclosure does not limit the layout of the extended upper leads and the extended lower leads for electrically connecting the extended vias. In some embodiments, the extended vias 214, 224 are disposed between the second lower leads 244 that are connected to the first vias 210 (e.g., the topmost first via 212) and the second lower leads 244 that are connected to the second vias 220 (e.g., the topmost second via 222).

Figure 10:
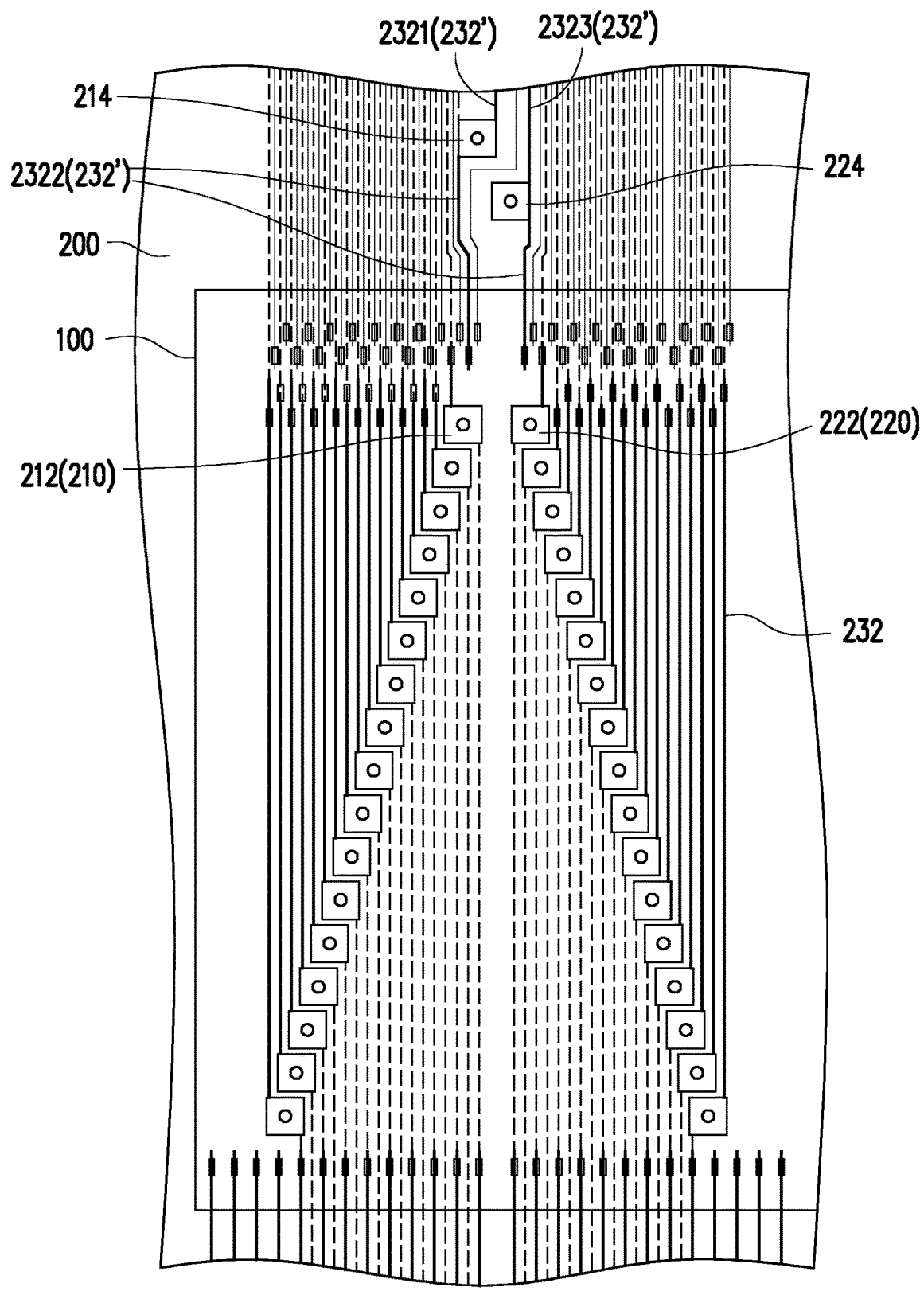
FIG. 10 illustrates a perspective top view of a chip on film package according to an embodiment of the disclosure.
Figure 11:
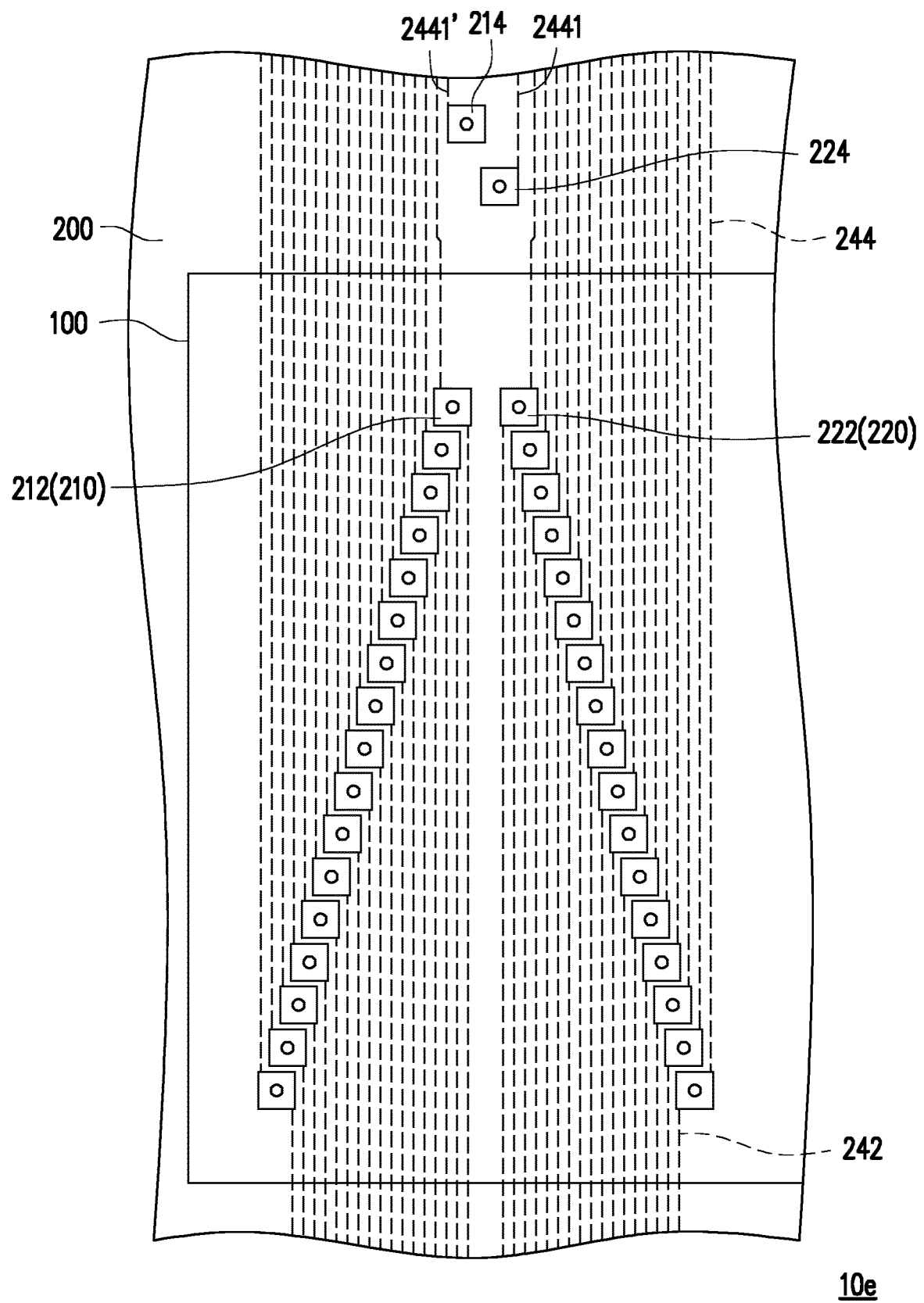
FIG. 11 illustrate a schematic bottom view of a chip on film package in FIG. 10.

FIG. 10 illustrates a perspective top view of a chip on film package according to an embodiment of the disclosure. FIG. 11 illustrate a schematic bottom view of a chip on film package in FIG. 10. It is noted that the chip on film package 10e shown in FIG. 10 and FIG. 11 contains many features same as or similar to the chip on film package 10d disclosed earlier with FIG. 8 and FIG. 9. For purpose of clarity and simplicity, detail description of same or similar features may be omitted, and the same or similar reference numbers denote the same or like components. The main differences between the chip on film package 10e shown in FIG. 10 and FIG. 11 and the chip on film package 10d disclosed earlier with FIG. 8 and FIG. 9 are described as follows.

With now reference to FIG. 10, in some embodiments, the extended upper leads 232' may include a first set of extended upper leads 2322 and a second set of extended upper leads 2321, 2323. The first set of extended upper leads 2322 are connected between the extended vias 214 and the second shifted set of first bumps 1121', and connected between the extended vias 224 and the second shifted set of first bumps 1121'. The second set of extended upper leads 2321 are connected to the extended vias 214 and extended away from the first side L1 of the chip 100. The second set of extended upper leads 2323 are connected to the extended vias 224 and extended away from the first side L1 of the chip 100. In some embodiments, the second set of extended upper leads 2321, 2323 may extend beyond the chip mounting area of the flexible film 200 for further electrical connection.

With now reference to FIG. 11, in some embodiments, the chip on film package 10e may further include one or more extended lower leads 2441, 2441', which are disposed on the lower surface S2 of the flexible film 200. In some embodiments, the extended lower leads 2441, 2441' are connected to the extended vias 214, 224 and extended to the first side L1 and/or the second side L2 of the chip 100. For example, the extended lower leads 2441 are connected to the extended vias 224 and extended away from the first side L1 and the second side L2 of the chip 100. The extended lower leads 2441' are connected to the extended vias 214 and extended away from the first side L1 and the second side L2 of the chip 100. Certainly, the disclosure does not limit the layout of the extended upper leads and the extended lower leads for electrically connecting the extended vias. In some embodiments, the extended vias 214, 224 are disposed between the second lower leads 244 that are connected to the first vias 210 (e.g., the topmost first via 212) and the second lower leads 244 that are connected to the second vias 220 (e.g., the topmost second via 222).

Figure 12:
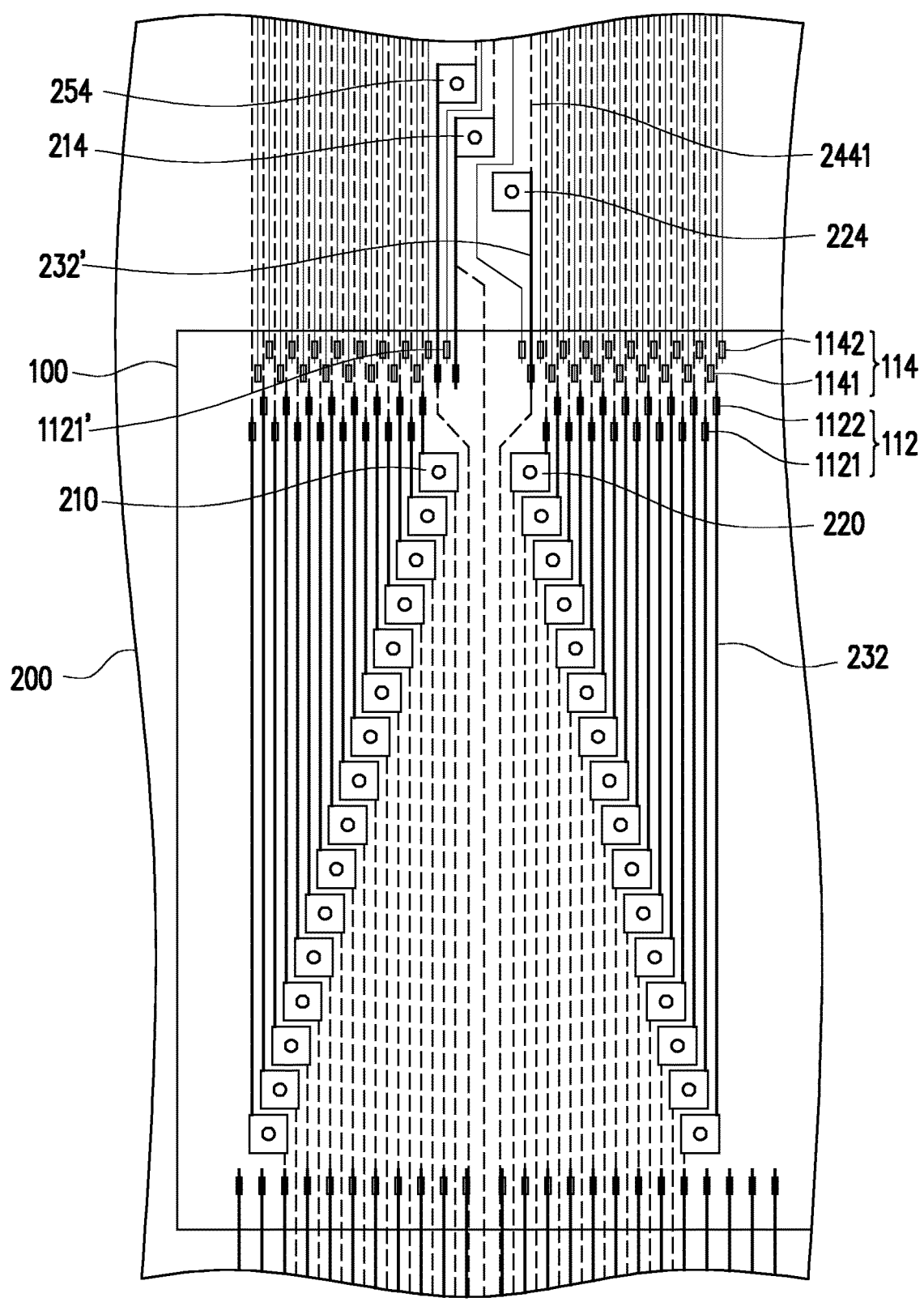
FIG. 12 illustrate a perspective top view of a chip on film package according to an embodiment of the disclosure.
Figure 13:
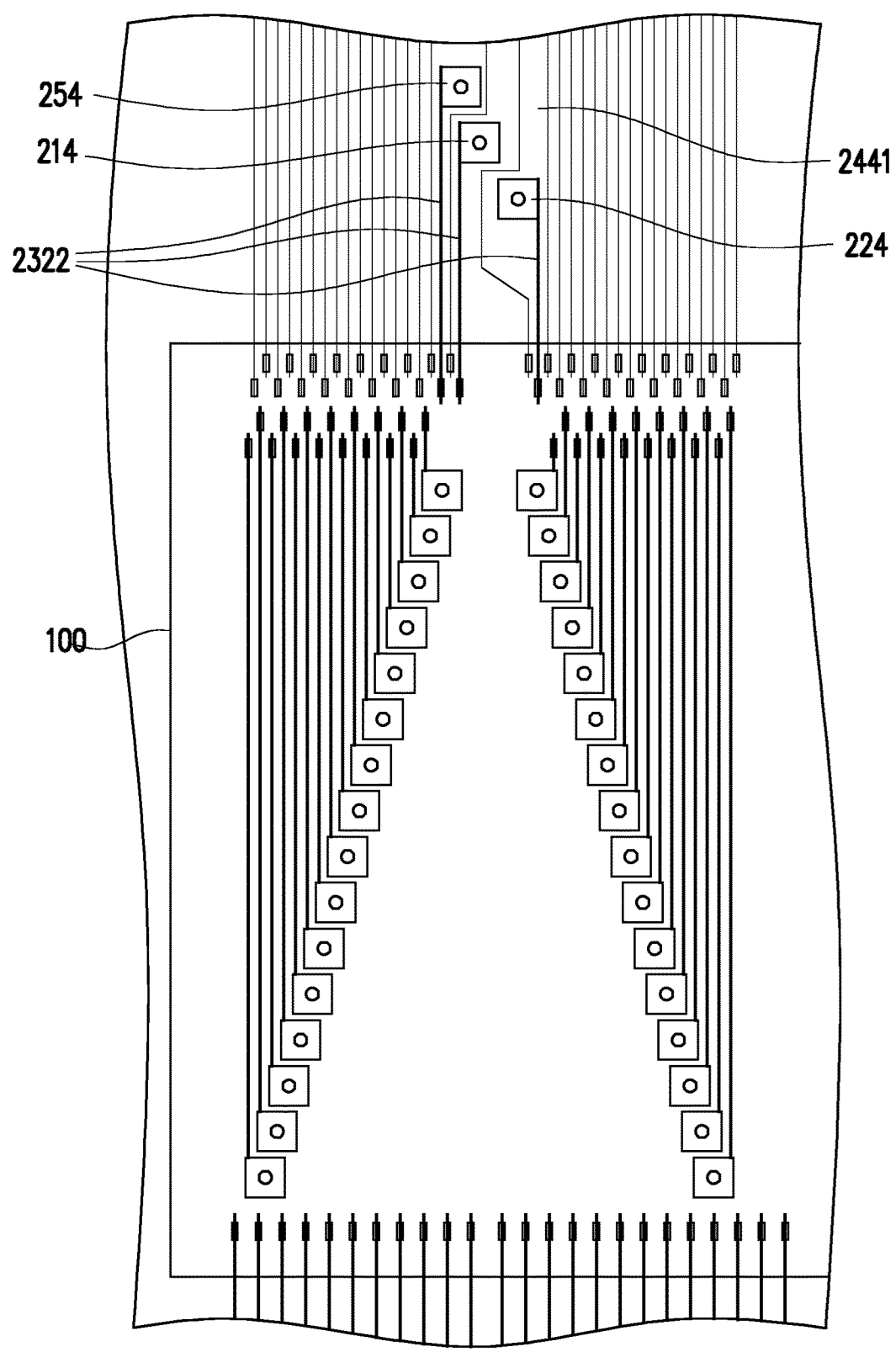
FIG. 13 illustrate a schematic top view of a chip on film package in FIG. 12.
Figure 14:
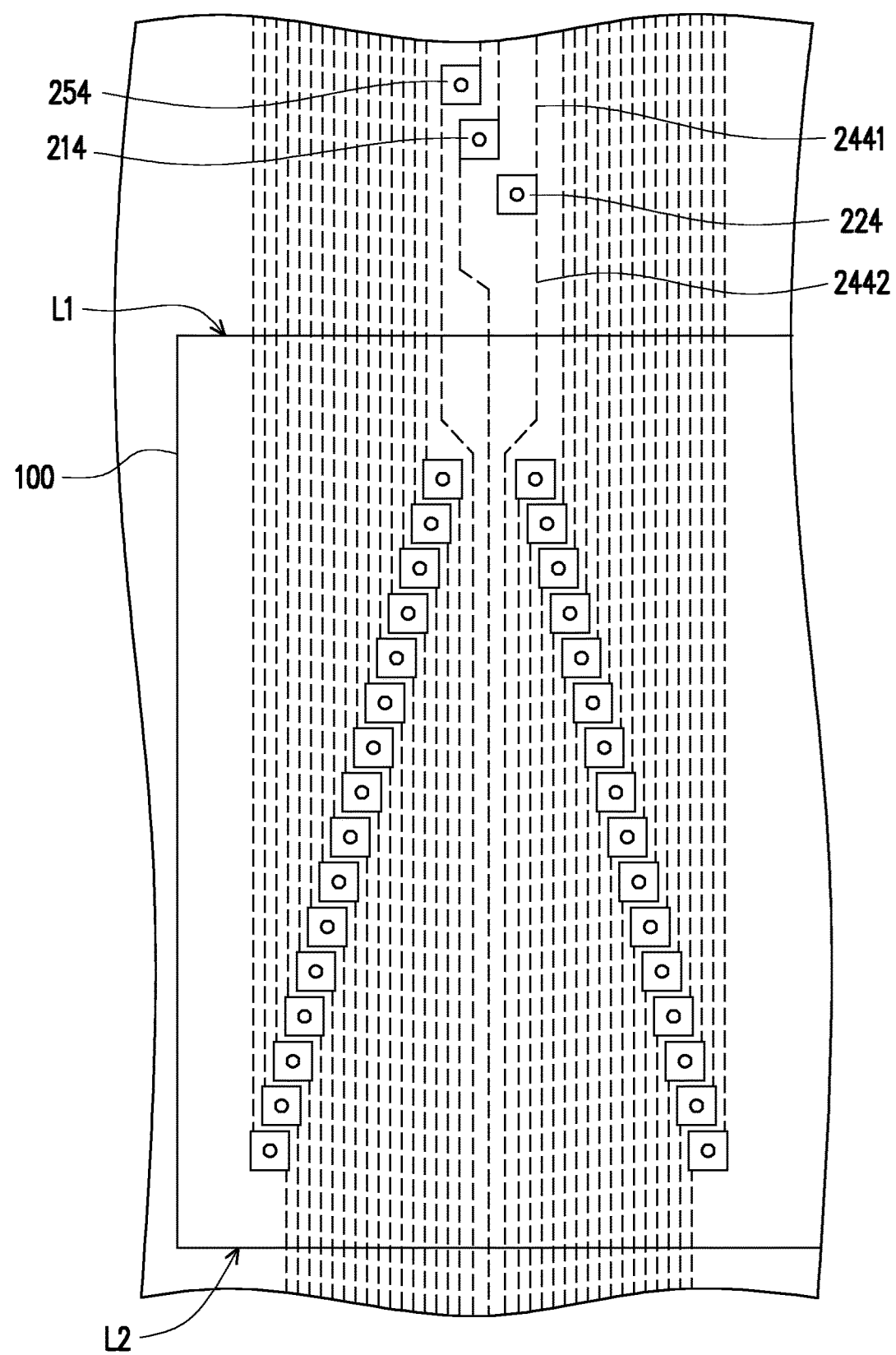
FIG. 14 illustrate a schematic bottom view of a chip on film package in FIG. 12.

FIG. 12 illustrate a perspective top view of a chip on film package according to an embodiment of the disclosure. FIG. 13 illustrate a schematic top view of a chip on film package in FIG. 12. FIG. 14 illustrate a schematic bottom view of a chip on film package in FIG. 12. It is noted that the chip on film package 10f shown in FIG. 12 to FIG. 14 contains many features same as or similar to the chip on film package 10e disclosed earlier with FIG. 10 and FIG. 11. For purpose of clarity and simplicity, detail description of same or similar features may be omitted, and the same or similar reference numbers denote the same or like components. The main differences between the chip on film package 10f shown in FIG. 12 to FIG. 14 and the chip on film package 10e disclosed earlier with FIG. 10 and FIG. 11 are described as follows.

With now reference to FIG. 12 to FIG. 14, in some embodiments, the chip on film package 10f may include one or more extended vias 214, 224, 254 (three extended vias 214, 224, 254 are illustrated, but not limited thereto) and one or more extended upper leads 232' (three extended upper leads 232' are illustrated, but not limited thereto). In some exemplary embodiments, the extended vias 214 may be the topmost first via 210 that is moved upward to an area beyond the chip mounting area of the flexible film 200. The extended vias 224 may be the topmost second via 220 that is moved upward to the area beyond the chip mounting area of the flexible film 200. The extended vias 254 may be an additional via that is disposed on the area beyond the chip mounting area of the flexible film 200. Certainly, the disclosure is not limited thereto. The extended vias 214, 224, 254 can be any kind of vias that is disposed beyond the chip mounting region of the flexible film 200 where the chip 100 is mounted. In some embodiments, the extended upper leads 232' are connected between the extended vias 214, 224, 254 and the second shifted set of first bumps 1121' as it is shown in FIG. 13.

With now reference to FIG. 14, in some embodiments, the chip on film package 10f may further include one or more extended lower leads 2441, 2442, which are disposed on the lower surface S2 of the flexible film 200. In some embodiments, the extended lower leads 2441, 2442 are connected to the extended vias 214, 224, 254 and extended toward and/or extended away from the first side L1 the chip 100. For example, the extended lower leads 2441 are connected to the extended vias 214, 224, 254 and extended away from the first side L1 and the second side L2 of the chip 100. The extended lower leads 2442 are connected to the extended vias 214, 224, 254 and extended toward the first side L1 and the second side L2 of the chip 100. Certainly, the disclosure does not limit the layout of the extended upper leads and the extended lower leads for electrically connecting the extended vias.

Figure 15:
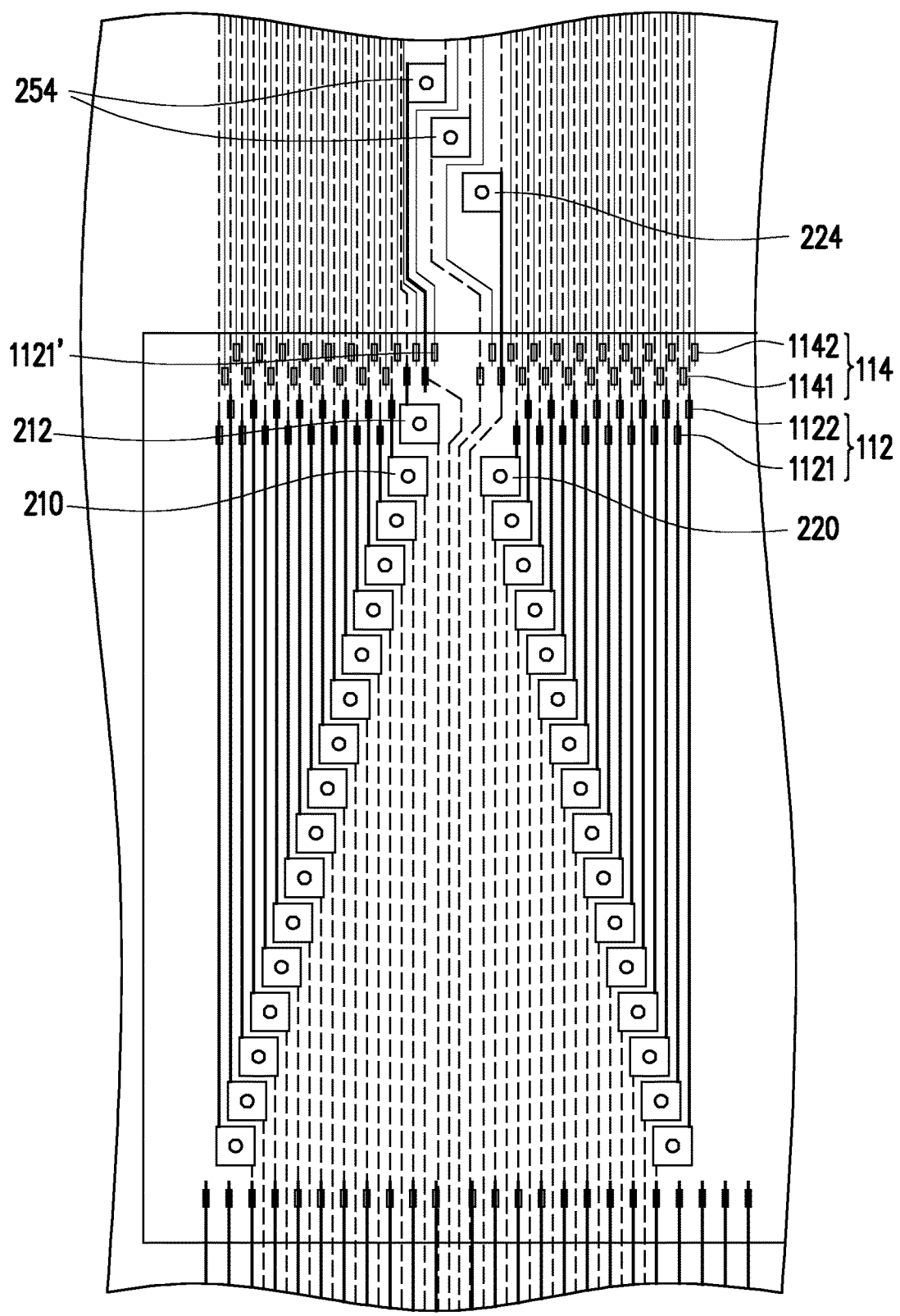
FIG. 15 illustrate a perspective top view of a chip on film package according to an embodiment of the disclosure.
Figure 16:
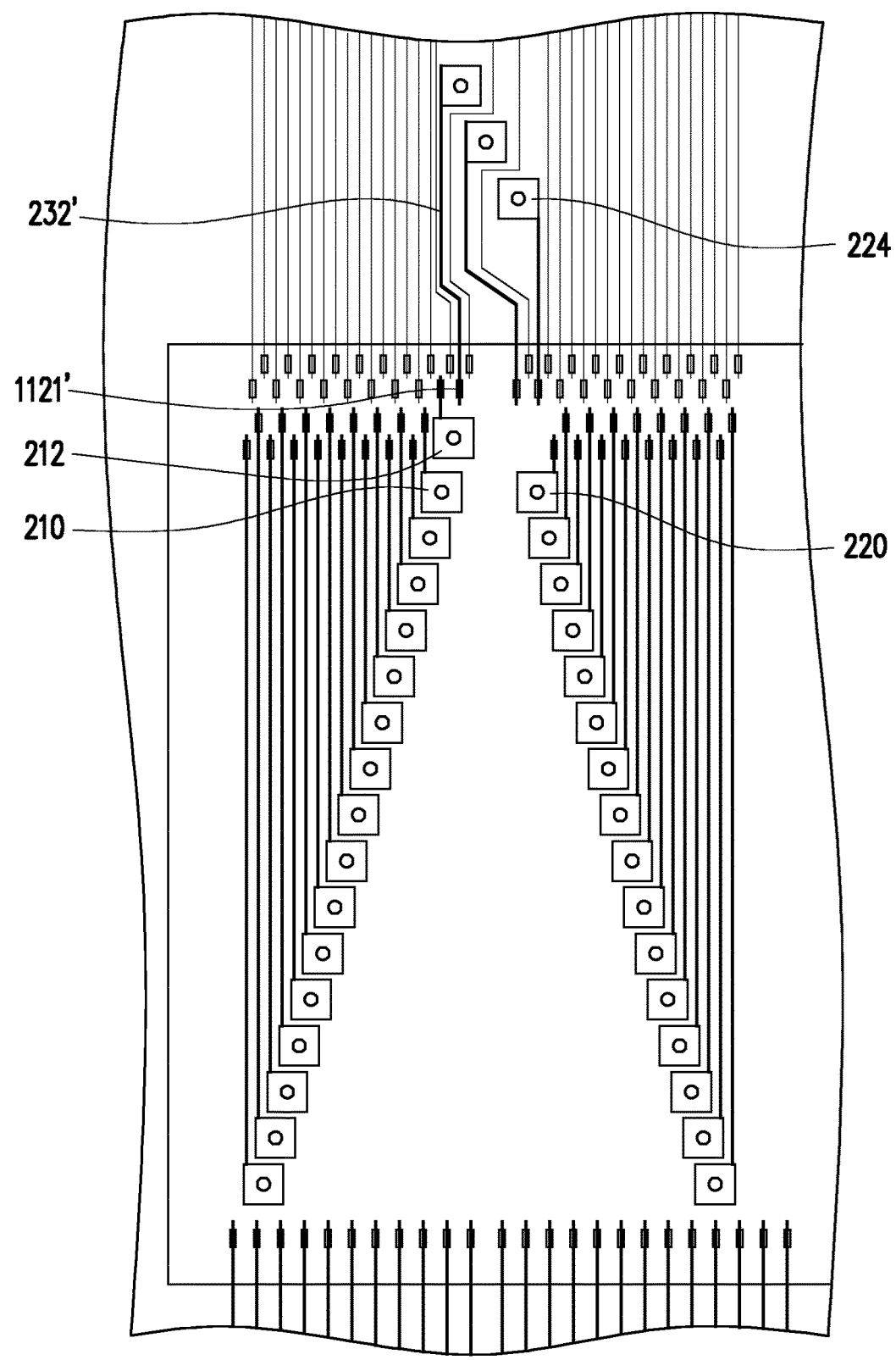
FIG. 16 illustrate a schematic top view of a chip on film package in FIG. 15.
Figure 17:
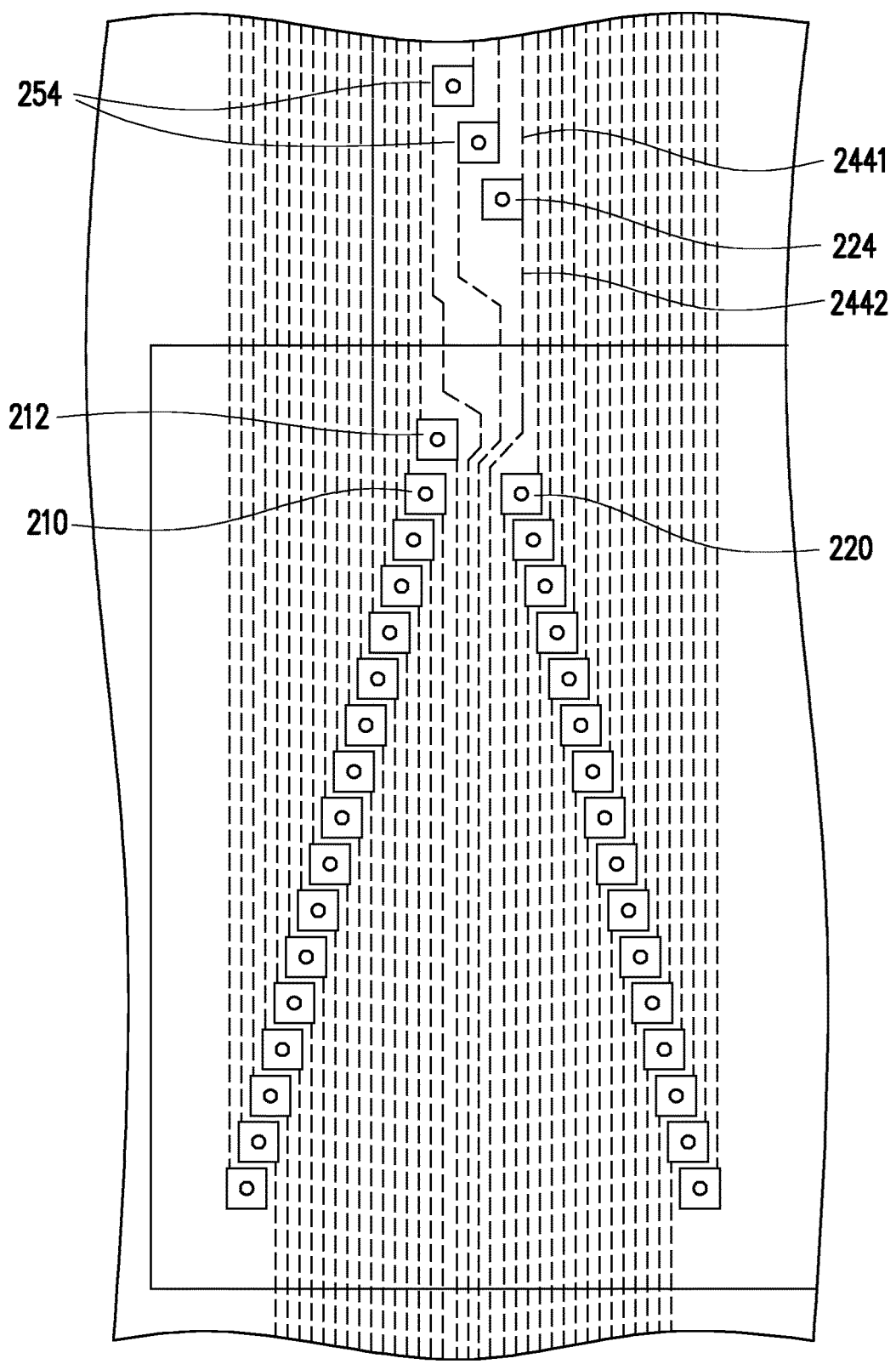
FIG. 17 illustrate a schematic bottom view of a chip on film package in FIG. 15.

FIG. 15 illustrate a perspective top view of a chip on film package according to an embodiment of the disclosure. FIG. 16 illustrate a schematic top view of a chip on film package in FIG. 15. FIG. 17 illustrate a schematic bottom view of a chip on film package in FIG. 15. It is noted that the chip on film package 10g shown in FIG. 15 to FIG. 17 contains many features same as or similar to the chip on film package 10f disclosed earlier with FIG. 12 and FIG. 14. For purpose of clarity and simplicity, detail description of same or similar features may be omitted, and the same or similar reference numbers denote the same or like components. The main differences between the chip on film package 10g shown in FIG. 15 to FIG. 17 and the chip on film package 10f disclosed earlier with FIG. 12 and FIG. 14 are described as follows.

With now reference to FIG. 15 to FIG. 17, in some embodiments, the chip on film package 10f may include one or more extended vias 224, 254 (three extended vias 224, 254 are illustrated, but not limited thereto) and one or more extended upper leads 232' (three extended upper leads 232' are illustrated, but not limited thereto). In some exemplary embodiments, one of the first vias (e.g. the topmost first vias 212) closest to the first bumps 112 are disposed between the first bumps 112. The extended vias 224 may be the topmost second via 220 being moved upward to the area beyond the chip mounting area of the flexible film 200. The extended vias 254 may be additional vias that are disposed on the area beyond the chip mounting area of the flexible film 200. Certainly, the disclosure is not limited thereto. The extended vias 224, 254 can be any kind of vias that is disposed beyond the chip mounting region of the flexible film 200 where the chip 100 is mounted. In some embodiments, the extended upper leads 232' are connected between the extended vias 224, 254 and the second shifted set of first bumps 1121' as it is shown in FIG. 16.

With now reference to FIG. 17, in some embodiments, the chip on film package 10g may further include one or more extended lower leads 2441, 2442, which are disposed on the lower surface of the flexible film 200. In some embodiments, the extended lower leads 2441, 2442 are connected to the extended vias 224, 254 and extended toward and/or extended away from the first side L1 the chip 100. For example, the extended lower leads 2441 are connected to the extended vias 224, 254 and extended away from the first side L1 and the second side L2 of the chip 100. The extended lower leads 2442 are connected to the extended vias 224, 254 and extended toward the first side L1 and the second side L2 of the chip 100. Certainly, the disclosure does not limit the layout of the extended upper leads and the extended lower leads for electrically connecting the extended vias.

Figure 18:
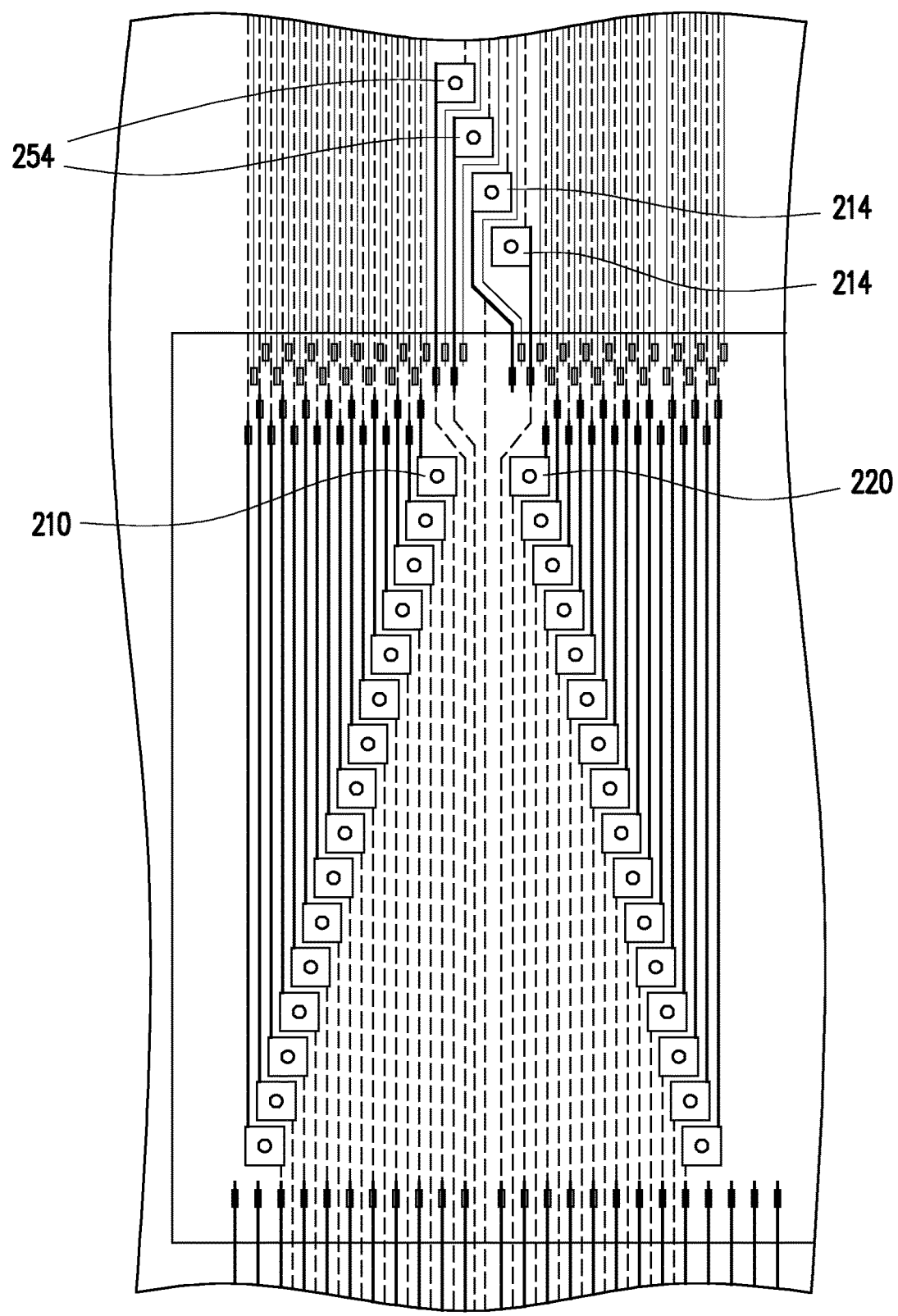
FIG. 18 illustrate a perspective top view of a chip on film package according to an embodiment of the disclosure.
Figure 19:
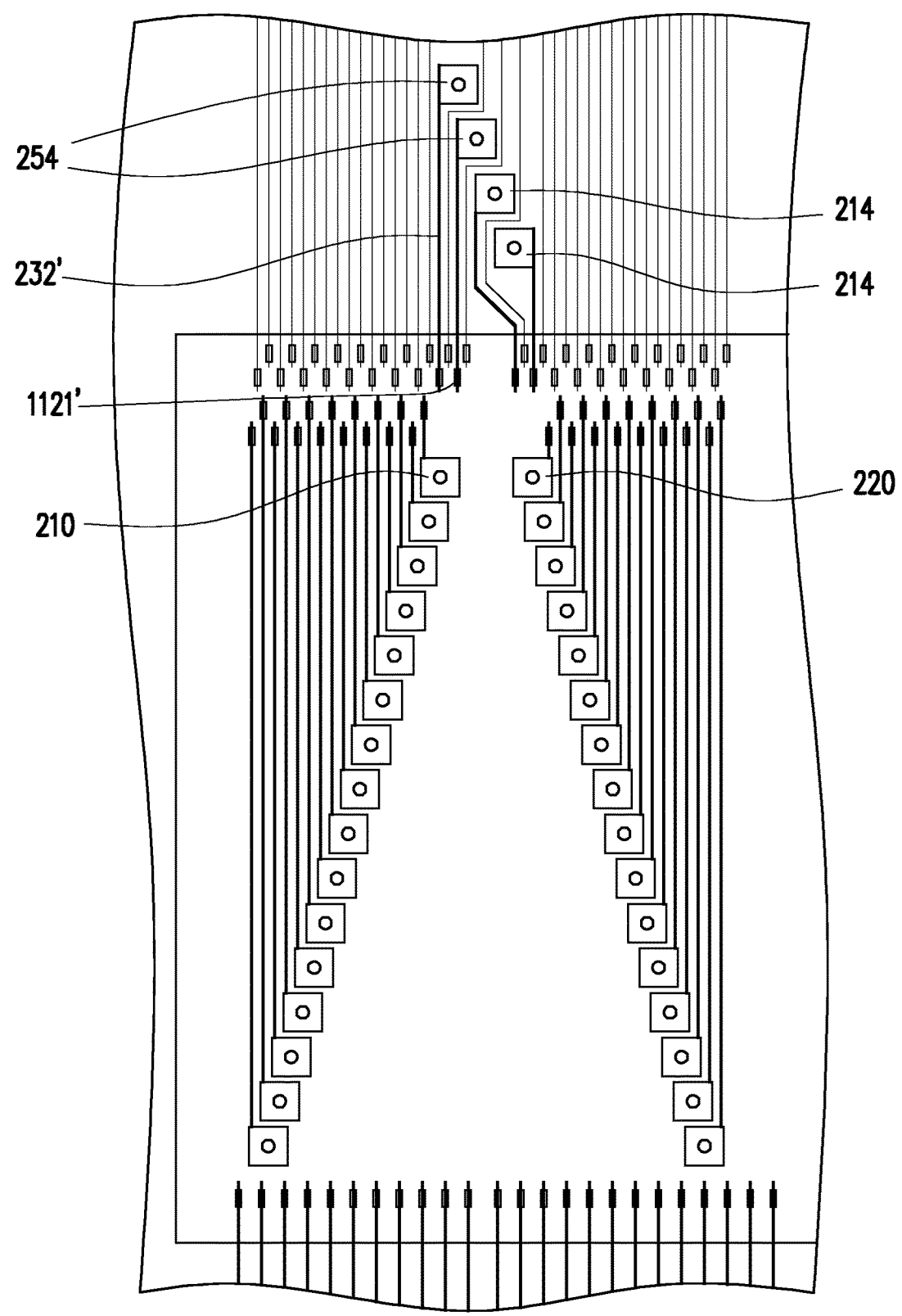
FIG. 19 illustrate a schematic top view of a chip on film package in FIG. 18.
Figure 20:
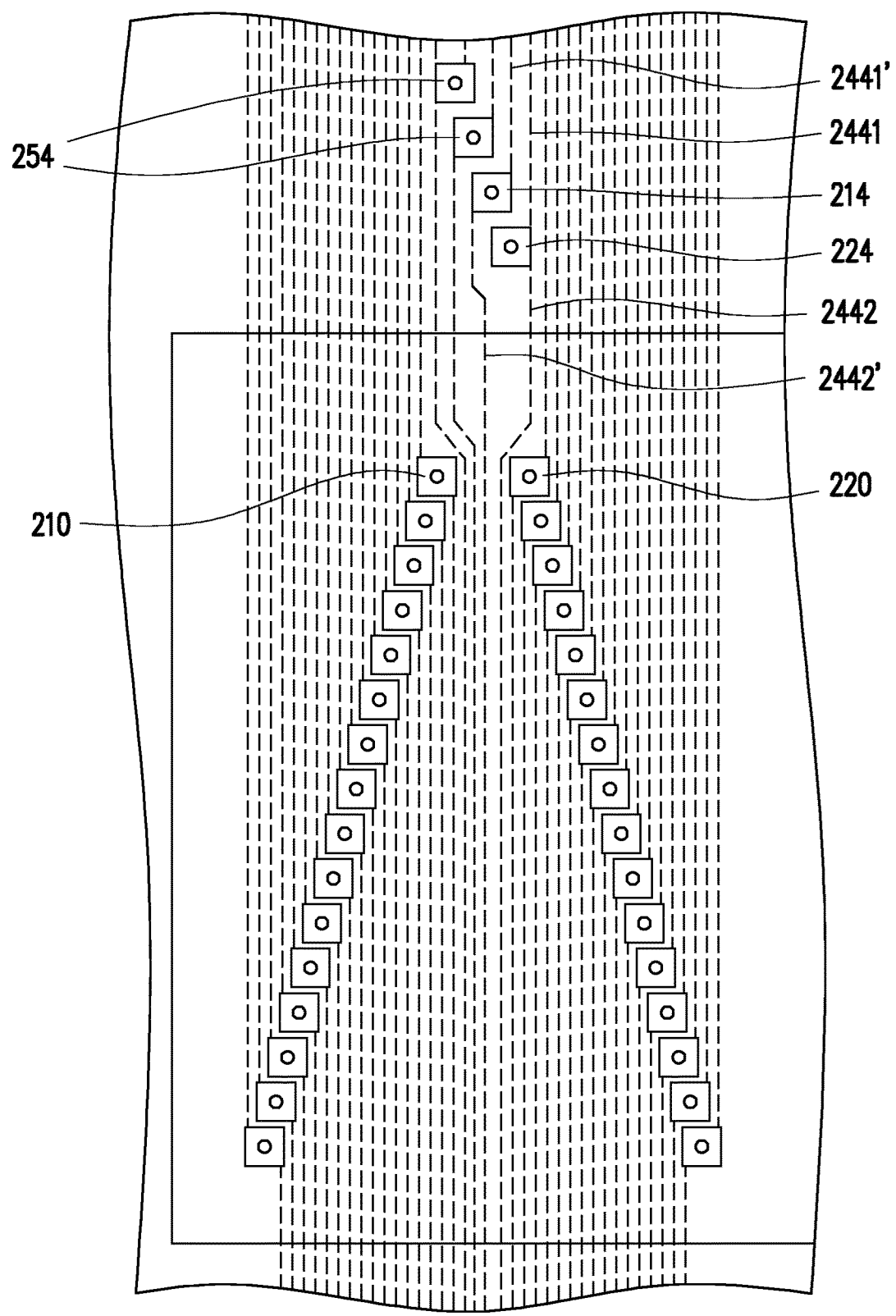
FIG. 20 illustrate a schematic bottom view of a chip on film package in FIG. 18.

FIG. 18 illustrate a perspective top view of a chip on film package according to an embodiment of the disclosure. FIG. 19 illustrate a schematic top view of a chip on film package in FIG. 18. FIG. 20 illustrate a schematic bottom view of a chip on film package in FIG. 18. It is noted that the chip on film package 10h shown in FIG. 18 to FIG. 20 contains many features same as or similar to the chip on film package 10g disclosed earlier with FIG. 15 and FIG. 17. For purpose of clarity and simplicity, detail description of same or similar features may be omitted, and the same or similar reference numbers denote the same or like components. The main differences between the chip on film package 10h shown in FIG. 18 to FIG. 20 and the chip on film package 10g disclosed earlier with FIG. 15 to FIG. 17 are described as follows.

With now reference to FIG. 18 to FIG. 20, in some embodiments, the chip on film package 10h may include one or more extended vias 214, 224, 254 (four extended vias 214, 224, 254 are illustrated, but not limited thereto) and one or more extended upper leads 232' (four extended upper leads 232' are illustrated, but not limited thereto). In some exemplary embodiments, the extended vias 214 may be the topmost first via 210 being moved upward to the area beyond the chip mounting area of the flexible film 200. The extended vias 224 may be the topmost second via 220 being moved upward to the area beyond the chip mounting area of the flexible film 200. The extended vias 254 may be additional vias that are disposed on the area beyond the chip mounting area of the flexible film 200. Certainly, the disclosure is not limited thereto. The extended vias 214, 224, 254 can be any kind of vias that is disposed beyond the chip mounting region of the flexible film 200 where the chip 100 is mounted. In some embodiments, the extended upper leads 232' are connected between the extended vias 214, 224, 254 and the second shifted set of first bumps 1121' as it is shown in FIG. 19.

With now reference to FIG. 20, in some embodiments, the chip on film package 10h may further include one or more extended lower leads 2441, 2442, which are disposed on the lower surface of the flexible film 200. In some embodiments, the extended lower leads 2441, 2442 are connected to the extended vias 214, 224, 254 and extended toward and/or extended away from the first side L1 the chip 100. For example, the extended lower leads 2441 are connected to the extended vias 214, 224, 254 and extended away from the first side L1 and the second side L2 of the chip 100. The extended lower leads 2442 are connected to the extended vias 214, 224, 254 and extended toward the first side L1 and the second side L2 of the chip 100. Certainly, the disclosure does not limit the layout of the extended upper leads and the extended lower leads for electrically connecting the extended vias.

Figure 21:
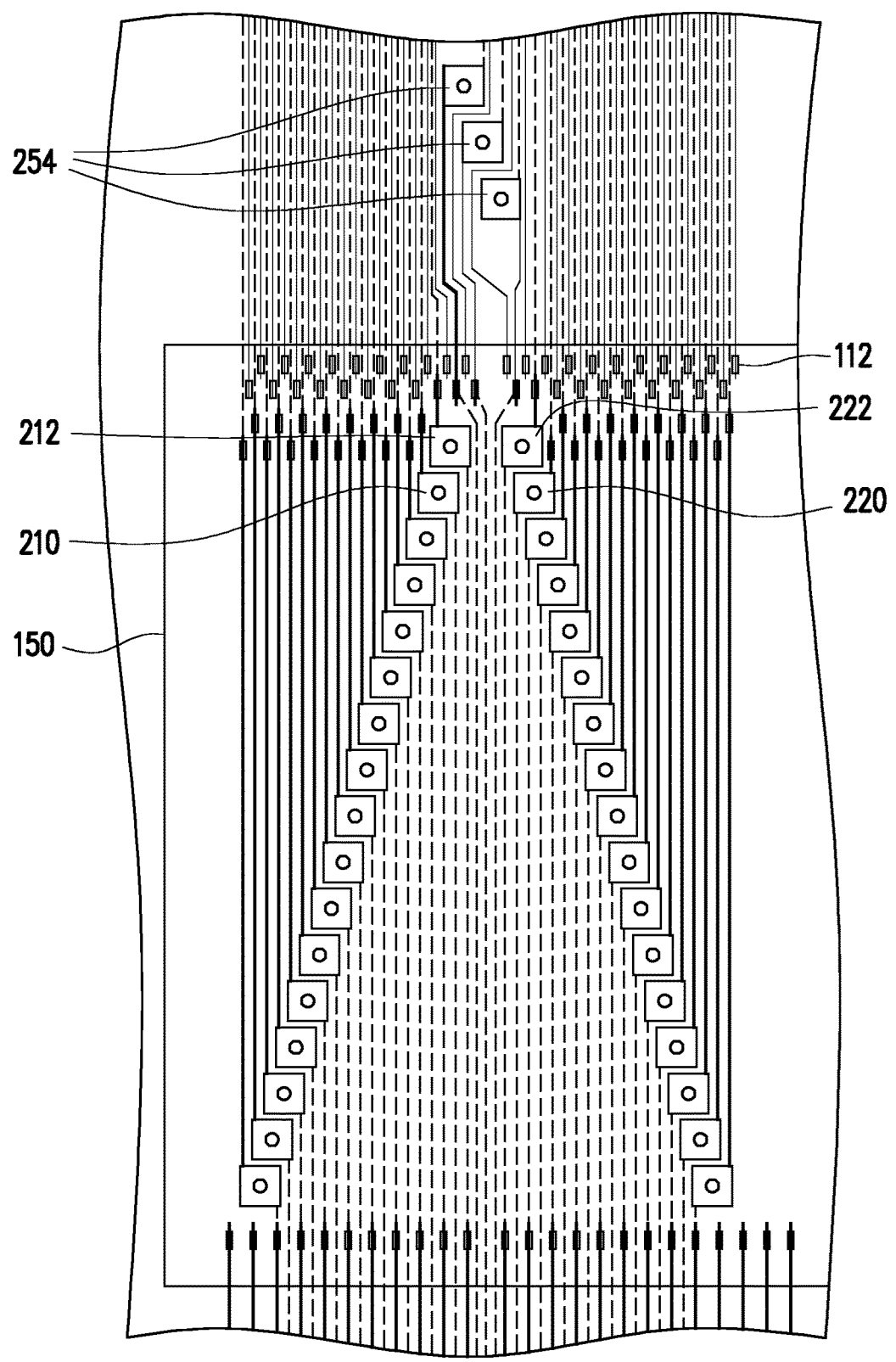
FIG. 21 illustrate a perspective top view of a chip on film package according to an embodiment of the disclosure.
Figure 22:
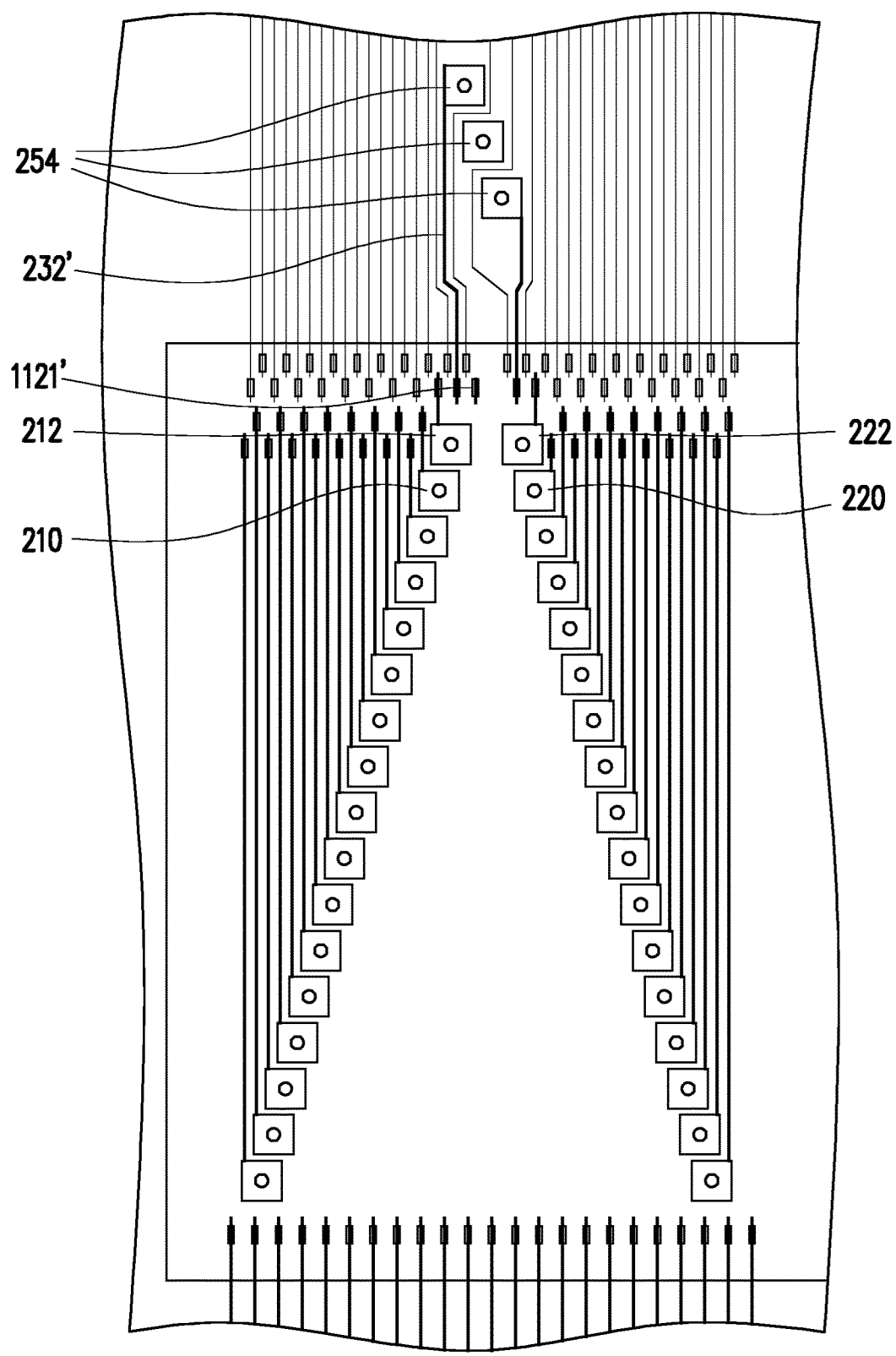
FIG. 22 illustrate a schematic top view of a chip on film package in FIG. 21.
Figure 23:
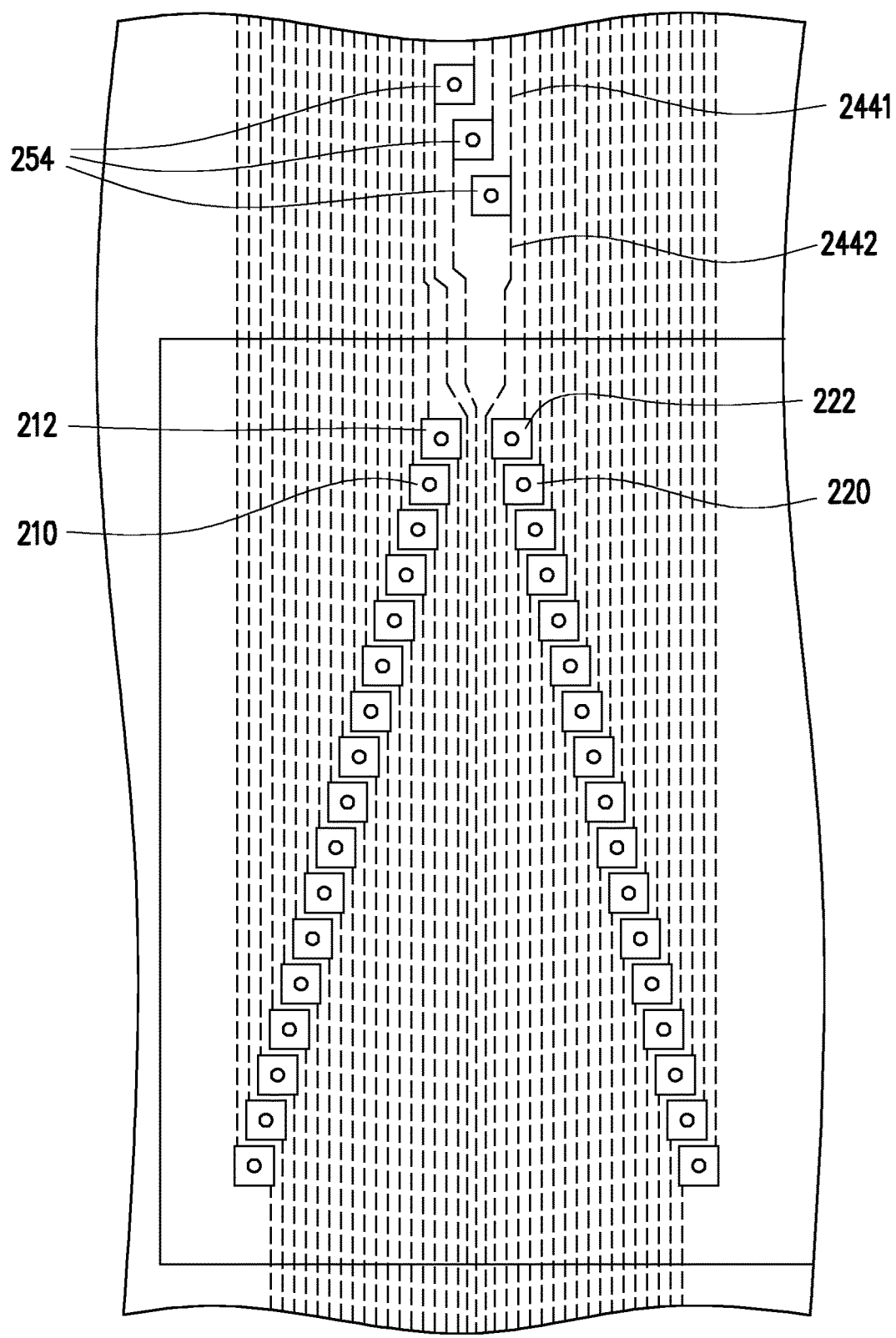
FIG. 23 illustrate a schematic bottom view of a chip on film package in FIG. 21.

FIG. 21 illustrate a perspective top view of a chip on film package according to an embodiment of the disclosure. FIG. 22 illustrate a schematic top view of a chip on film package in FIG. 21. FIG. 23 illustrate a schematic bottom view of a chip on film package in FIG. 21. It is noted that the chip on film package 10i shown in FIG. 21 to FIG. 23 contains many features same as or similar to the chip on film package 10h disclosed earlier with FIG. 18 and FIG. 20. For purpose of clarity and simplicity, detail description of same or similar features may be omitted, and the same or similar reference numbers denote the same or like components. The main differences between the chip on film package 10i shown in FIG. 21 to FIG. 23 and the chip on film package 10h disclosed earlier with FIG. 18 to FIG. 20 are described as follows.

With now reference to FIG. 21 to FIG. 23, in some embodiments, the chip on film package 10i may include one or more extended vias 254 (three extended vias 254 are illustrated, but not limited thereto) and one or more extended upper leads 232' (three extended upper leads 232' are illustrated, but not limited thereto). In some exemplary embodiments, one of the first vias (e.g. the topmost first vias 212) closest to the first bumps 112 are disposed between the first bumps 112. one of the second vias (e.g. the topmost second vias 222) closest to the first bumps 112 are disposed between the first bumps 112. The extended vias 254 may be additional vias that are disposed on the area beyond the chip mounting area of the flexible film 200. Certainly, the disclosure is not limited thereto. The extended vias 254 can be any kind of vias that is disposed beyond the chip mounting region of the flexible film 200 where the chip 100 is mounted. In some embodiments, the extended upper leads 232' are connected between the extended vias 254 and the second shifted set of first bumps 1121' as it is shown in FIG. 22.

With now reference to FIG. 23, in some embodiments, the chip on film package 10i may further include one or more extended lower leads 2441, 2442, which are disposed on the lower surface of the flexible film 200. In some embodiments, the extended lower leads 2441, 2442 are connected to the extended vias 254 and extended toward and/or extended away from the first side L1 the chip 100. For example, the extended lower leads 2441 are connected to the extended vias 254 and extended away from the first side L1 and the second side L2 of the chip 100. The extended lower leads 2442 are connected to the extended vias 254 and extended toward the first side L1 and the second side L2 of the chip 100. Certainly, the disclosure does not limit the layout of the extended upper leads and the extended lower leads for electrically connecting the extended vias.

Figure 24:
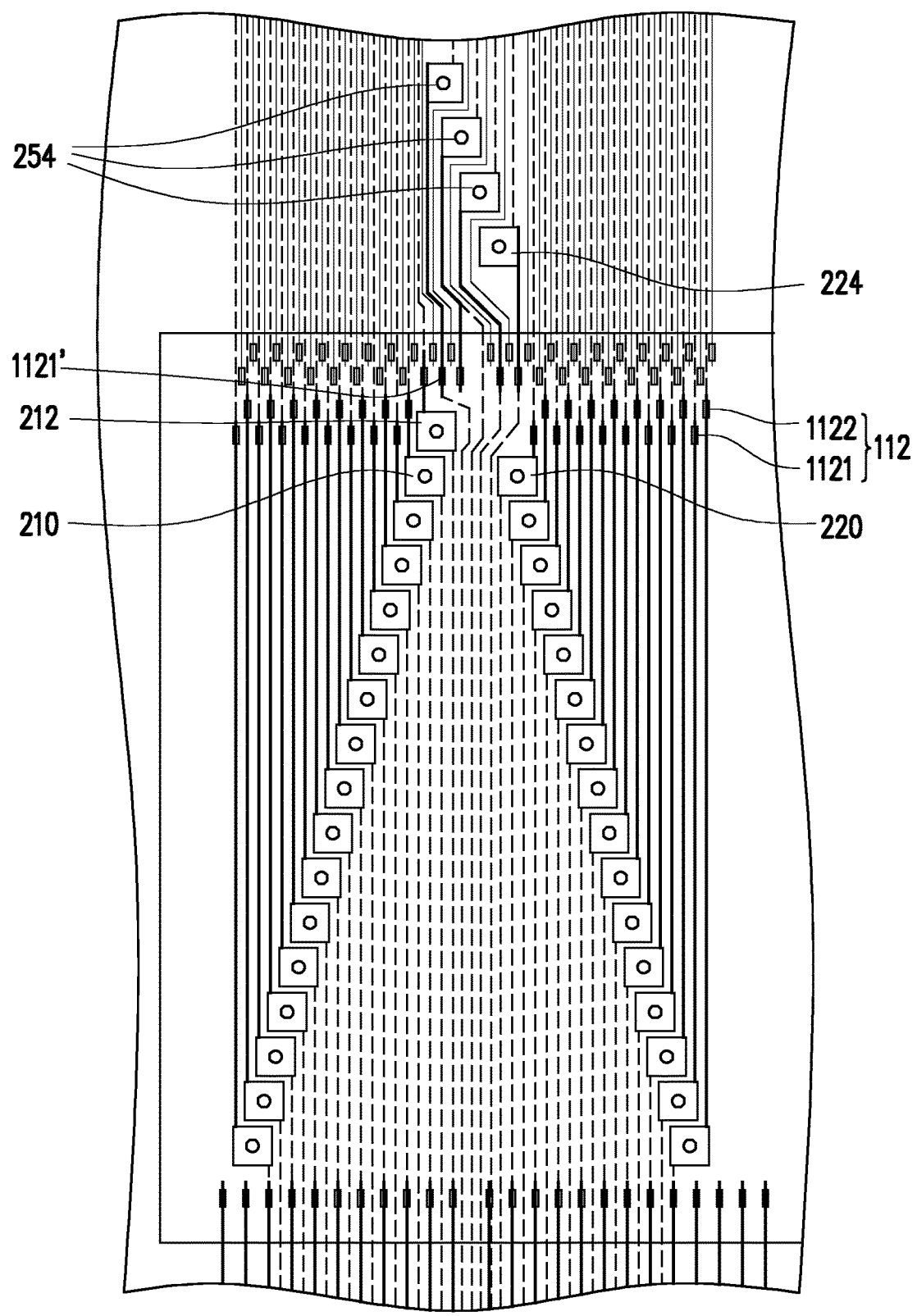
FIG. 24 illustrate a perspective top view of a chip on film package according to an embodiment of the disclosure.
Figure 25:
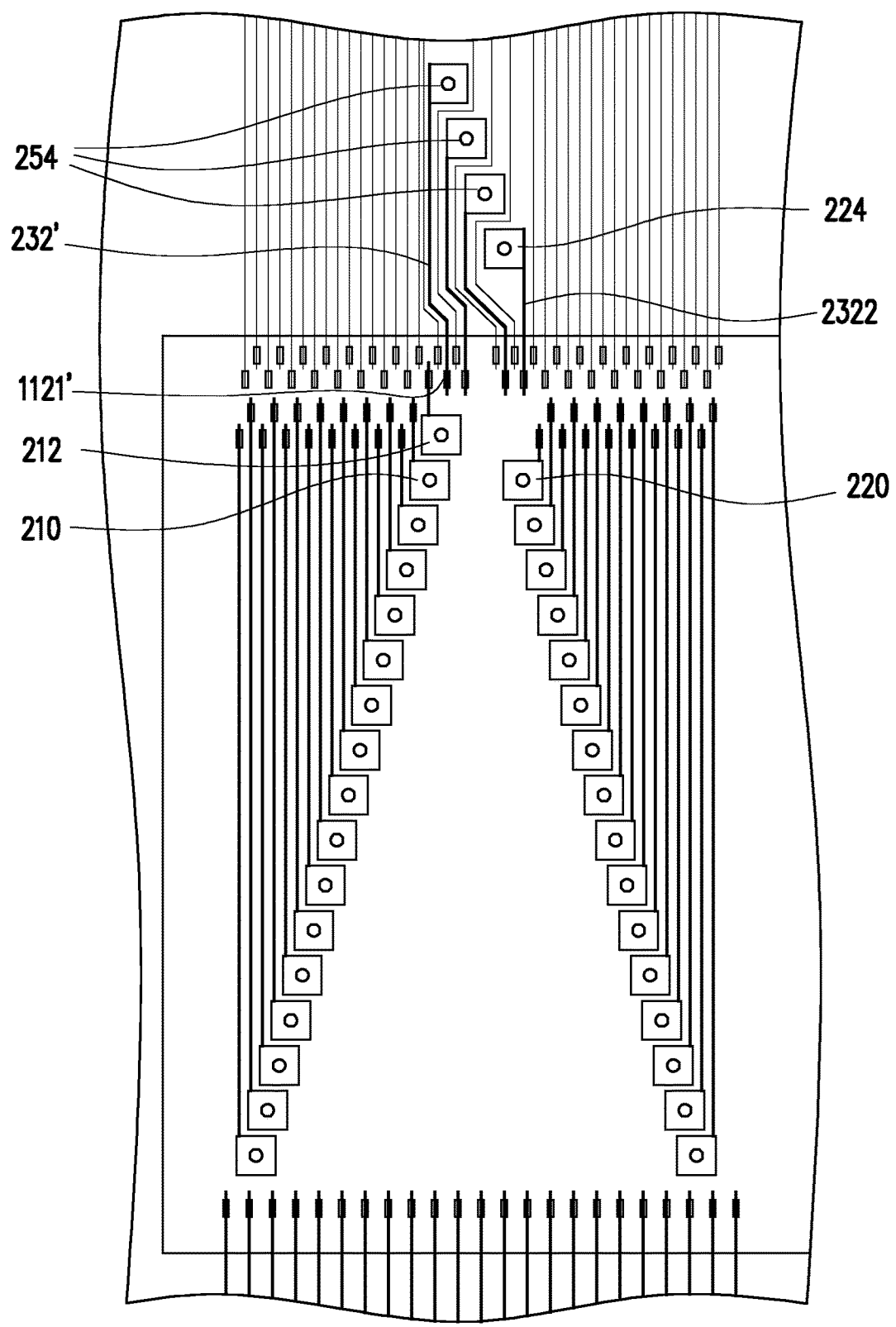
FIG. 25 illustrate a schematic top view of a chip on film package in FIG. 24.
Figure 26:
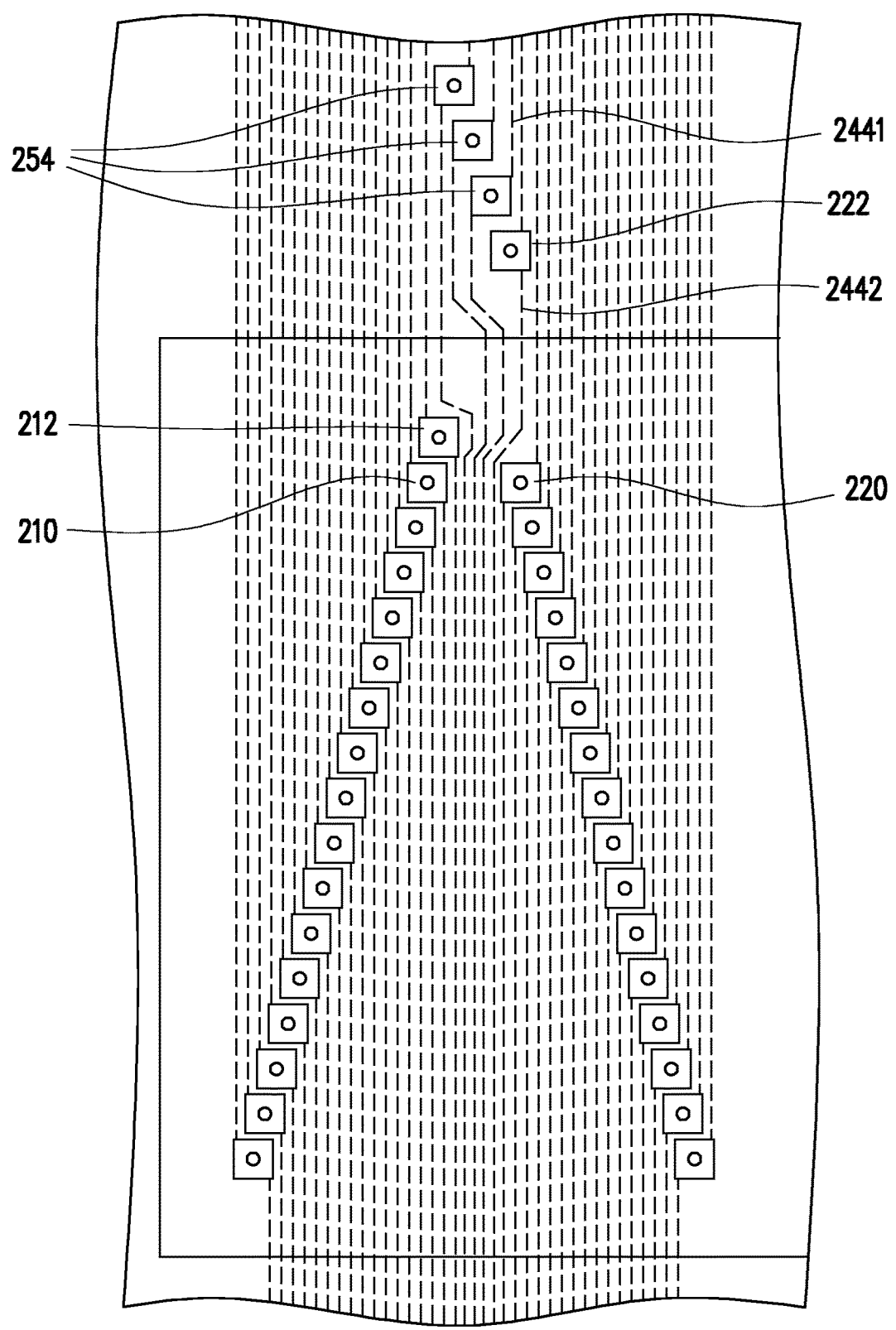
FIG. 26 illustrate a schematic bottom view of a chip on film package in FIG. 24.

FIG. 24 illustrate a perspective top view of a chip on film package according to an embodiment of the disclosure. FIG. 25 illustrate a schematic top view of a chip on film package in FIG. 24. FIG. 26 illustrate a schematic bottom view of a chip on film package in FIG. 24. It is noted that the chip on film package 10j shown in FIG. 24 to FIG. 26 contains many features same as or similar to the chip on film package 10i disclosed earlier with FIG. 21 and FIG. 26. For purpose of clarity and simplicity, detail description of same or similar features may be omitted, and the same or similar reference numbers denote the same or like components. The main differences between the chip on film package 10j shown in FIG. 24 and FIG. 26 and the chip on film package 10i disclosed earlier with FIG. 21 to FIG. 23 are described as follows.

With now reference to FIG. 24 and FIG. 26, in some embodiments, the chip on film package 10j may include one or more extended vias 224, 254 (four extended vias 224, 254 are illustrated, but not limited thereto) and one or more extended upper leads 232' (four extended upper leads 232' are illustrated, but not limited thereto). In some exemplary embodiments, one of the first vias (e.g. the topmost first vias 212) closest to the first bumps 112 are disposed between the first bumps 112. The extended vias 224 may be the topmost second via being moved upward to the area beyond the chip mounting area of the flexible film 200. The extended vias 254 may be additional vias that are disposed on the area beyond the chip mounting area of the flexible film 200. Certainly, the disclosure is not limited thereto. The extended vias 224, 254 can be any kind of vias that is disposed beyond the chip mounting region of the flexible film 200 where the chip 100 is mounted. In some embodiments, the extended upper leads 232' are connected between the extended vias 224, 254 and the second shifted set of first bumps 1121' as it is shown in FIG. 25.

With now reference to FIG. 26, in some embodiments, the chip on film package 10j may further include one or more extended lower leads 2441, 2442, which are disposed on the lower surface of the flexible film 200. In some embodiments, the extended lower leads 2441, 2442 are connected to the extended vias 224, 254 and extended toward and/or extended away from the first side L1 the chip 100. For example, the extended lower leads 2441 are connected to the extended vias 224, 254 and extended away from the first side L1 and the second side L2 of the chip 100. The extended lower leads 2442 are connected to the extended vias 224, 254 and extended toward the first side L1 and the second side L2 of the chip 100. Certainly, the disclosure does not limit the layout of the extended upper leads and the extended lower leads for electrically connecting the extended vias.

Figure 27:
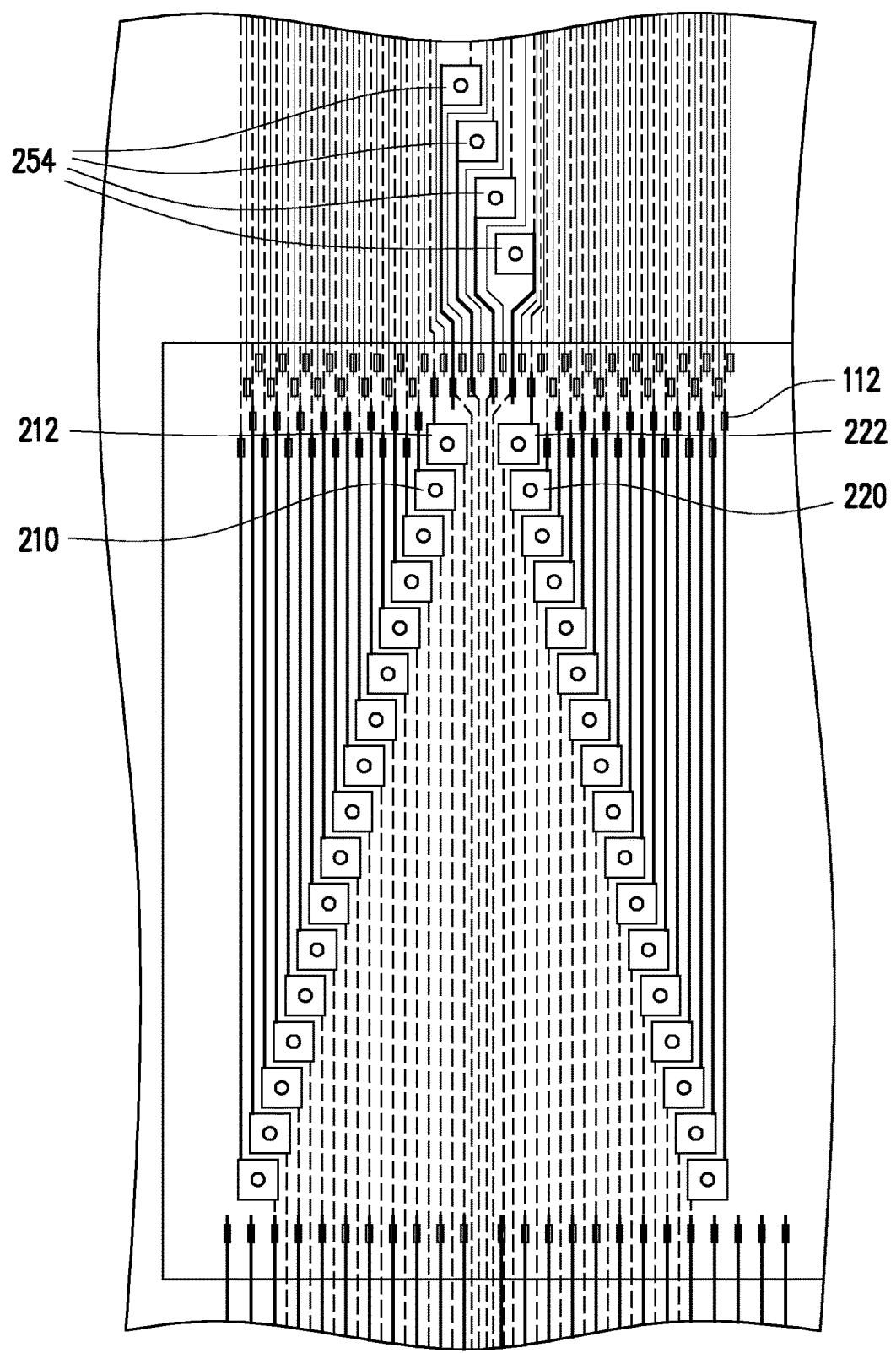
FIG. 27 illustrate a perspective top view of a chip on film package according to an embodiment of the disclosure.
Figure 28:
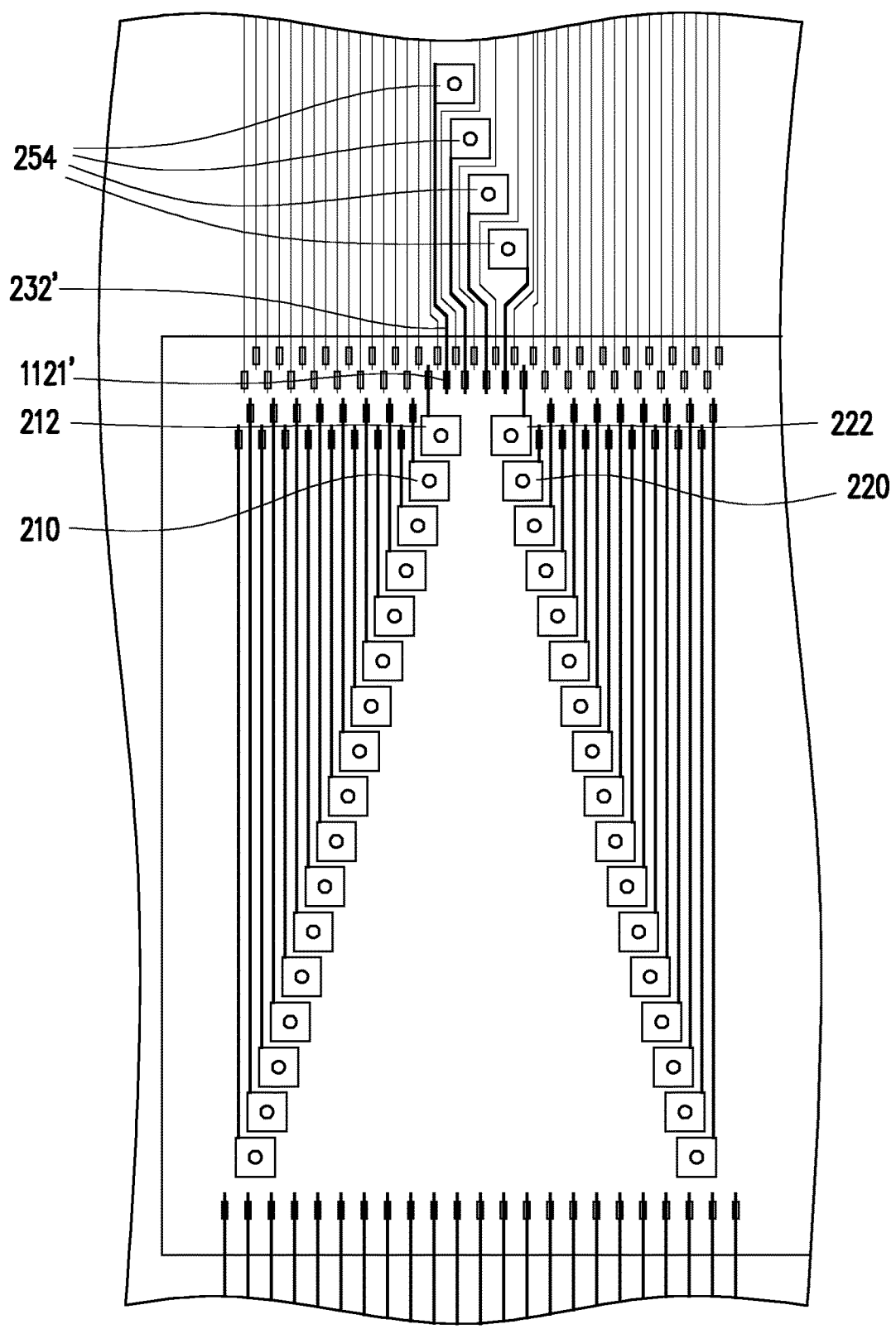
FIG. 28 illustrate a schematic top view of a chip on film package in FIG. 27.
Figure 29:
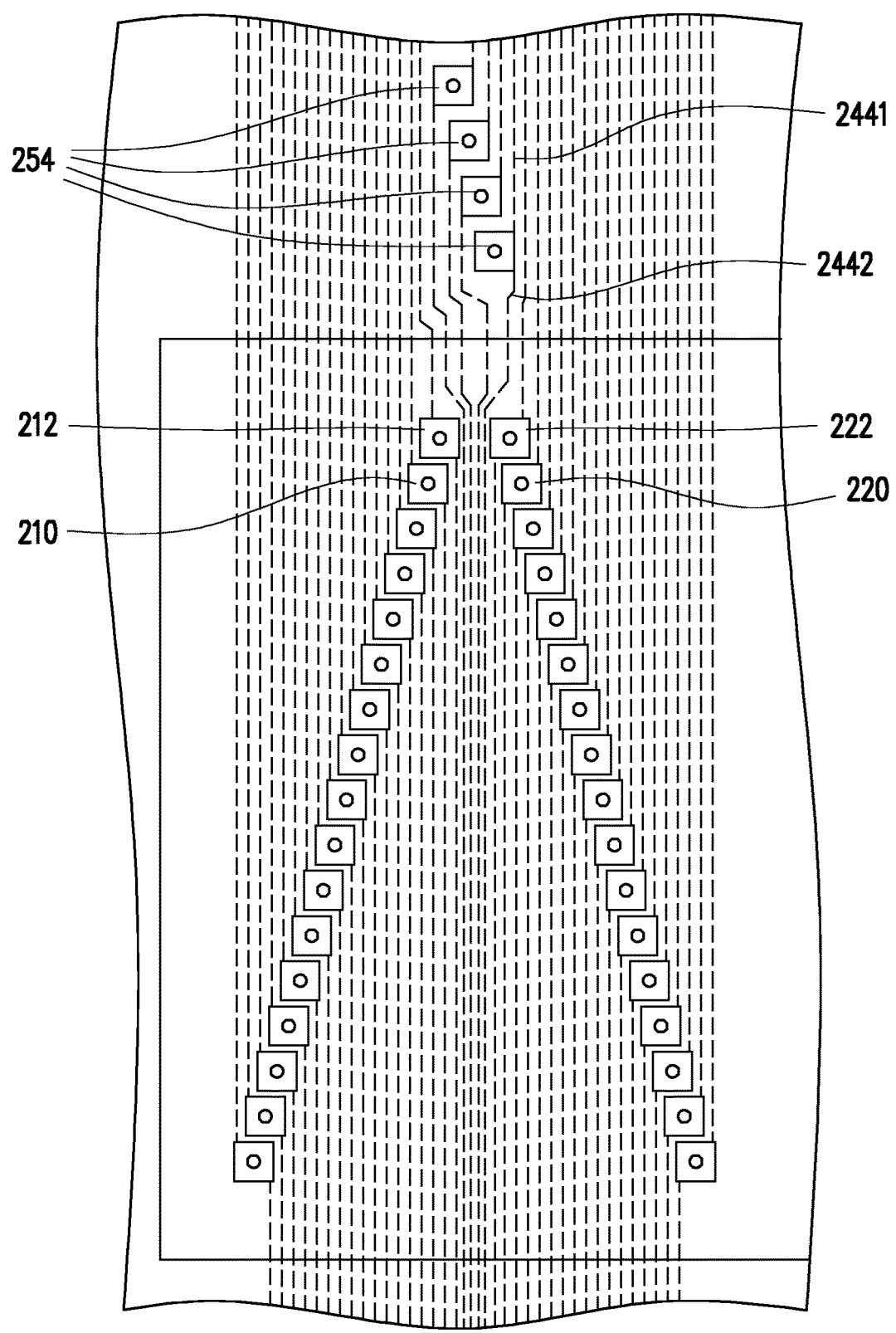
FIG. 29 illustrate a schematic bottom view of a chip on film package in FIG. 27.

FIG. 27 illustrate a perspective top view of a chip on film package according to an embodiment of the disclosure. FIG. 28 illustrate a schematic top view of a chip on film package in FIG. 27. FIG. 29 illustrate a schematic bottom view of a chip on film package in FIG. 27. It is noted that the chip on film package 10k shown in FIG. 27 to FIG. 29 contains many features same as or similar to the chip on film package 10j disclosed earlier with FIG. 24 and FIG. 26. For purpose of clarity and simplicity, detail description of same or similar features may be omitted, and the same or similar reference numbers denote the same or like components. The main differences between the chip on film package 10k shown in FIG. 27 to FIG. 29 and the chip on film package 10j disclosed earlier with FIG. 24 and FIG. 26 are described as follows.

With now reference to FIG. 27 to FIG. 29, in some embodiments, the chip on film package 10k may include one or more extended vias 254 (four extended vias 254 are illustrated, but not limited thereto) and one or more extended upper leads 232' (four extended upper leads 232' are illustrated, but not limited thereto). In some exemplary embodiments, one of the first vias (e.g. the topmost first vias 212) closest to the first bumps 112 are disposed between the first bumps 112. One of the second vias (e.g. the topmost second vias 222) closest to the first bumps 112 are disposed between the first bumps 112. The extended vias 254 may be additional vias that are disposed on the area beyond the chip mounting area of the flexible film 200. Certainly, the disclosure is not limited thereto. The extended vias 254 can be any kind of vias that is disposed beyond the chip mounting region of the flexible film 200 where the chip 100 is mounted. In some embodiments, the extended upper leads 232' are connected between the extended vias 254 and the second shifted set of first bumps 1121' as it is shown in FIG. 28.

With now reference to FIG. 29, in some embodiments, the chip on film package 10k may further include one or more extended lower leads 2441, 2442, which are disposed on the lower surface of the flexible film 200. In some embodiments, the extended lower leads 2441, 2442 are connected to the extended vias 254 and extended toward and/or extended away from the first side L1 the chip 100. For example, the extended lower leads 2441 are connected to the extended vias 254 and extended away from the first side L1 and the second side L2 of the chip 100. The extended lower leads 2442 are connected to the extended vias 254 and extended toward the first side L1 and the second side L2 of the chip 100. Certainly, the disclosure does not limit the layout of the extended upper leads and the extended lower leads for electrically connecting the extended vias.

Based on the above discussions, it can be seen that the present disclosure offers various advantages. It is understood, however, that not all advantages are necessarily discussed herein, and other embodiments may offer different advantages, and that no particular advantage is required for all embodiments.

In sum, in the chip on film package of the disclosure, the first vias and the second vias penetrating the flexible film are arranged on two opposite sides of a reference line respectively, and the distances between the first vias and the second vias are gradually increased from one side to another side of the chip. With such arrangement, the layout area of the vias can be reduced, and the size of the chip can be reduced accordingly, especially the chip length along a longitudinal direction of the chip. Moreover, under a predetermined chip length, the pitches of the bumps along a transversal direction of the chip can be reduced, and the number of the bumps can be increased accordingly. Therefore, a space utilizing efficiency of the chip on film package can be significantly improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
    a chip comprising a plurality of bumps disposed on an active surface of the chip, wherein the bumps comprise a plurality of first bumps arranged as a first row along a first direction, and a plurality of second bump arranged as a second row along a second direction; and
    a flexible film, wherein the chip is mounted on the flexible film via the active surface, and the flexible film comprises:
        a plurality of first vias penetrating the flexible film;
        a plurality of second vias penetrating the flexible film, wherein the first vias and the second vias are arranged on two opposite sides of a first side of a reference line respectively and the second vias are arranged on a second side of the reference line, wherein a shortest horizontal distance between one of the first vias and a closest one of the second vias is increased from a first side of the chip to a second side of the chip;
        a plurality of upper leads disposed on the upper surface connected between the first vias and the bumps and between the second vias and the bumps; and
        a plurality of lower leads disposed on the lower surface, connected to the first vias and the second vias, and extending toward the first side or a second side of the chip opposite to the first side, wherein each of the second bumps is closer to the first side of the chip than each of the first bumps is, and one of the first vias and/or one of the second vias closest to the first bumps are disposed between the first bumps.

2. The chip on film package according to claim 1, wherein the first vias are arranged along a first arrangement direction not parallel to the reference line, and the second vias are arranged along a second arrangement direction not parallel to the reference line.

3. The chip on film package according to claim 1, wherein the first vias are arranged symmetrically to the second vias with respect to the reference line.

4. The chip on film package according to claim 1, wherein one of the second bumps is located between adjacent two of the first bumps.

5. The chip on film package according to claim 1, wherein the first bumps are odd-numbered output bumps and the second bumps are even-numbered output bumps.

6. The chip on film package according to claim 1, wherein the first bumps are even-numbered output bumps and the second bumps are odd-numbered output bumps.

7. The chip on film package according to claim 1, wherein the lower leads comprise a plurality of first lower leads connected to the first vias and the second vias and extending toward one of the first side and the second side of the chip.

8. The chip on film package according to claim 1, wherein the upper leads comprise:
    a plurality of first upper leads connected between the first vias and the first bumps and/or connected between the second vias and the first bumps; and
    a plurality of second upper leads connected to the second bumps respectively and extending toward the first side of the chip.

9. The chip on film package according to claim 8, wherein the lower leads further comprises a plurality of second lower leads connected the first vias and the second vias and extending toward the other one of the first side and the second side of the chip.

10. The chip on film package according to claim 1, wherein the chip further comprises a plurality of third bumps disposed on the second side of the chip.

11. The chip on film package according to claim 10, wherein the flexible film further comprises a plurality of third upper leads disposed on the upper surface, connected to the third bumps, and extending toward the second side of the chip.

12. The chip on film package according to claim 11, wherein the third bumps comprise output bumps of the chip.

13. The chip on film package according to claim 11, wherein the third bumps comprise input bumps of the chip.

14. The chip on film package according to claim 1, wherein the first bumps comprises a first set of the first bumps and a second set of the first bumps arranged along the first direction in a staggered manner.

15. The chip on film package according to claim 1, wherein the second bumps comprises a first set of the second bumps and a second set of the second bumps arranged along the second direction in a staggered manner.

16. The chip on film package according to claim 14, wherein one of the first vias and/or one of the second vias closest to the first bumps are disposed between the first bumps.

17. The chip on film package according to claim 16, wherein the first bumps comprise a first shifted set of first bumps coupled to the one of the first vias and the one of the second vias closest to the first bumps and disposed between the second bumps along the second direction.

18. The chip on film package according to claim 1, further comprising one or more extended vias disposed beyond a chip mounting region of the flexible film where the chip is mounted.

19. The chip on film package according to claim 1, wherein
the plurality of first bumps connected by the upper leads to the first vias and the second vias; and
the plurality of second bumps connected to the upper leads without being connected to the first vias and the second vias.

20. The chip on film package according to claim 1, further comprising one or more extended vias disposed beyond a chip mounting region of the flexible film where the chip is mounted.

21. The chip on film package according to claim 20, wherein the lower leads further comprises a plurality of second lower leads connected the first vias and the second vias, the extended vias are disposed between the second lower leads connected to the first vias and the second lower leads connected to the second vias.

22. A chip on film package, comprising:
a chip comprising a plurality of bumps disposed on an active surface of the chip, wherein the bumps comprise a plurality of first bumps arranged as a first row along a first direction, and a plurality of second bump arranged as a second row along a second direction; and
a flexible film, wherein the chip is mounted on the flexible film via the active surface, and the flexible film comprises:
a plurality of first vias penetrating the flexible film;
a plurality of second vias penetrating the flexible film, wherein the first vias and the second vias are arranged on two opposite sides of a first side of a reference line respectively and the second vias are arranged on a second side of the reference line, wherein a shortest horizontal distance between one of the first vias and a closest one of the second vias is increased from a first side of the chip to a second side of the chip;
a plurality of upper leads disposed on the upper surface connected between the first vias and the bumps and between the second vias and the bumps; and
a plurality of lower leads disposed on the lower surface, connected to the first vias and the second vias, and extending toward the first side or a second side of the chip opposite to the first side, wherein each of the second bumps is closer to the first side of the chip than each of the first bumps is; and
one or more extended vias disposed beyond a chip mounting region of the flexible film where the chip is mounted, wherein the first bumps comprise a second shifted set of first bumps connected to the one or more extended vias and disposed between the second bumps along the second direction.

23. The chip on film package according to claim 22, further comprising one or more extended lower leads disposed on the lower surface of the flexible film and connected to the one or more extended vias and extended toward and/or extended away from the first side the chip.

24. The chip on film package according to claim 22, further comprising one or more extended upper leads disposed on the upper surface of the flexible film and connected to the one or more extended vias.

25. The chip on film package according to claim 24, wherein the extended vias are disposed between the second lower leads connected to the first vias and the second lower leads connected to the second vias.

26. A chip on film package, comprising:
a chip comprising a plurality of bumps disposed on an active surface of the chip, wherein the bumps comprise a plurality of first bumps arranged as a first row along a first direction, and a plurality of second bump arranged as a second row along a second direction; and
a flexible film, wherein the chip is mounted on the flexible film via the active surface, and the flexible film comprises:
a plurality of first vias penetrating the flexible film;
a plurality of second vias penetrating the flexible film, wherein the first vias and the second vias are arranged on two opposite sides of a first side of a reference line respectively and the second vias are arranged on a second side of the reference line, wherein a shortest horizontal distance between one of the first vias and a closest one of the second vias is increased from a first side of the chip to a second side of the chip;
a plurality of upper leads disposed on the upper surface connected between the first vias and the bumps and between the second vias and the bumps; and
a plurality of lower leads disposed on the lower surface, connected to the first vias and the second vias, and extending toward the first side or a second side of the chip opposite to the first side, wherein each of the second bumps is closer to the first side of the chip than each of the first bumps is,
wherein the first bumps connected by the upper leads to the first vias and the second vias, the second bumps connected to the upper leads without being connected to the first vias and the second vias, wherein the first bumps comprise a first shifted set of first bumps coupled to one of the first vias and one of the second vias closest to the first bumps and disposed between the second bumps along the second direction.

* * * * *